(12) United States Patent
Nagai

(10) Patent No.: US 6,434,064 B2
(45) Date of Patent: Aug. 13, 2002

(54) SEMICONDUCTOR MEMORY DEVICE HAVING REDUNDANCY CIRCUIT FOR SAVING FAULTY MEMORY CELLS

(75) Inventor: Takeshi Nagai, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/888,414

(22) Filed: Jun. 26, 2001

(30) Foreign Application Priority Data

Jun. 27, 2000 (JP) ........................................ 2000-193210

(51) Int. Cl.$^7$ ................................................. G11C 7/00
(52) U.S. Cl. ................ 365/200; 365/225.7; 365/230.03
(58) Field of Search ............................. 365/200, 225.7, 365/230.03, 189.01, 230.01

(56) References Cited

U.S. PATENT DOCUMENTS 6,188,618 B1    2/2001    Takase
6,259,636 B1  * 7/2001   Fukuda et al. ............... 365/200

OTHER PUBLICATIONS

S. Takase et al., "A. 1.6GB/s DRAM with Flexible Mapping Redundancy Technique and Additional Refresh Scheme", 1999, IEEE ISSCC. Dig. Tech. Papers, pp. 410–411.

* cited by examiner

Primary Examiner—Hoai Ho
(74) Attorney, Agent, or Firm—Banner & Witcoff, Ltd.

(57) ABSTRACT

In a semiconductor memory device comprising a redundancy circuit for saving a faulty memory cell, there are provided a plurality of fuse sets to which a flexible mapping redundancy technique is applied. For at least one of these plurality of fuse sets, there is used a row/column common saving fuse set configured so as to make it available for use in one of row saving and column saving. Even in the case where a number of row faults occur with a memory chip or in the case where a number of column faults occur, the setting of row saving or column saving of a row/column common saving fuse set is adjusted accordingly, whereby saving efficiency is improved, and high saving efficiency in a small area can be achieved.

23 Claims, 15 Drawing Sheets

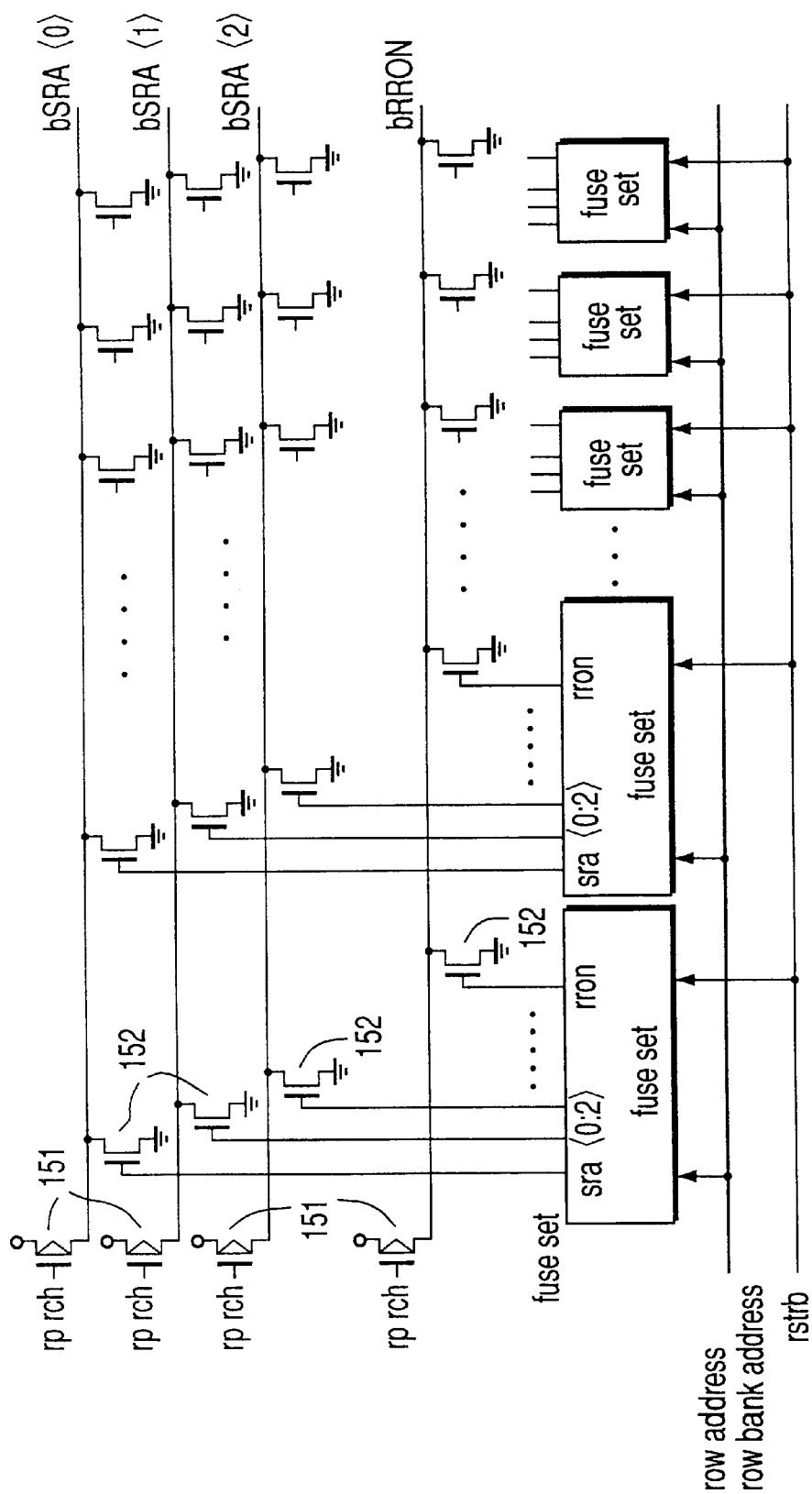
F I G. 15

F I G. 16

SEMICONDUCTOR MEMORY DEVICE HAVING REDUNDANCY CIRCUIT FOR SAVING FAULTY MEMORY CELLS

CROSS-REFERENCE TO RELATED APPLICATIONS

This application is based upon and claims the benefit of priority from the prior Japanese Patent Applications No. 2000-193210, filed Jun. 27, 2000, the entire contents of both of which are incorporated herein by reference.

BACKGROUND OF THE INVENTION

1. Field of the Invention

The present invention relates to a semiconductor memory device. In particular, the present invention relates to a semiconductor memory device comprising a redundancy circuit for saving a faulty memory cell.

2. Description of the Related Art

In a semiconductor memory device, in the case where a faulty memory cell has been detected, there is adopted a redundancy circuit system (redundancy system) in which the faulty memory cell is replaced with a redundancy cell, that is, a redundancy cell is used in place of a faulty memory cell, thereby improving the yield of the semiconductor storage device. Currently, in a generally employed redundancy system, one or plural rows of memory cell arrays or one or plural columns are defined as a replacement unit (namely, a saving unit). The replacement unit of memory cells including a faulty memory cell, in a sub-block called a saving block unit for saving such faulty memory cells is replaced with a redundancy saving unit (spare element) having the same size. In the case where a faulty sub-block containing such faulty memory cell has been detected, a spare element is used in place of such faulty cell block.

In order to store an address information of a replacement unit containing a faulty memory cell, it is required to employ a nonvolatile storage element. Currently, a fuse is generally used. Address information is generally composed of a plurality of bits, and thus, a fuse set of plural fuses that correspond to such plurality of bits becomes a unit of storage of address information on one sub-block. In general, the number of spare elements corresponds to that of fuse sets one by one, and thus, the fuse sets whose number is the same as that of spare elements are arranged in a memory chip. In the case of using such spare element, the fuse in the fuse sets that correspond to the spare elements is disconnected according to address information on a faulty cell. This system is simple in configuration, and is currently widely used.

In a semiconductor memory, memory cells are arranged in a planar (two dimensional) manner. Currently, it is well known to store "0" or "1" bit information in one memory cell. As address information for designating one memory cell, there are used two addresses, row address and column address. That is, two coordinates, i.e., an X-coordinate (row address) and a Y-coordinate (column address) are used in order to designate one memory cell. In order to save a faulty memory cell, two circuits, i.e., a row redundancy circuit and a column redundancy circuit are mounted so as to use any of a method for saving the faulty memory cell with a row spare element and a method for saving the faulty memory cell with a column spare element. However, the number of faults that can be saved with the row spare element is independent of the number of faults that can be saved with the column spare element.

As described above, a redundancy system requires a redundancy circuit such as spare element and fuse set. In a conventional redundancy system in which the spare element corresponds to the fuse set in number one by one, the number of fuse sets increases with an increased number of spare elements, and a memory chip area also increases. In this case, the fuse set generally requires a larger area than the spare element, and thus, the area efficiency of the redundancy circuit is significantly lowered.

In order to solve this problem, there are proposed a variety of redundancy systems that improve the area efficiency of the redundancy circuit. For example, there is known a flexible redundancy system (refer to "Fault-Tolerant Design for 256 Mb DRAM" (IEEE JOURNAL OF SOLID-STATE CIRCUITS, VOL. 31, No. 4, April 1996) proposed by Kirihata et al. for example. In this system, one spare element covers a wide cell array region. Thus, even in the case where faulty cells locally, i.e. collectively, exist at a portion of a memory chip, such faulty cells can be saved in a manner similar to a case in which faults are distributed uniformly in a cell array. Because of this, this system reduces the number of spare elements, whereby the area efficiency of the redundancy circuit can be improved. In addition, this system is effective in the case where the average number of faulty cells per memory chip is identified or can be predicted.

On the other hand, in recent years, there has been developed a memory chip on which a memory cell array is divided into a plurality of sections. For example, there is a memory chip having a plurality of banks, wherein these banks are activated at the same time. In such a memory chip, it is impossible to use a row spare element in a bank, for saving faulty memory cells in units of rows as a row spare element in another bank. Thus, a spare element is unavoidably provided for each bank. More banks increase the number of divisions in memory cell arrays in a memory chip, and thus, one spare element can cover only a small cell array area. Even in the case where the spare element can cover only such small cell array region or even in the case where faults locally exist at a portion of a memory cell array, the spare element must be provided for such each small cell array region in order to save faulty cells. Therefore, the total number of spare elements significantly increases, resulting in a significant increase in required memory chip area. That is, in view of the entire memory chip, the number of spare elements that significantly exceeds the average number of faulty cells per memory chip is incorporated in one memory chip, and thus, the area efficiency of the memory chip is degraded.

In addition, in a semiconductor memory device required to transfer a large amount of data at one time due to the pursuit of high speed, a column is divided in fine units. Thus, a column spare element for saving a faulty memory cell in units of columns is unavoidably provided for each column unit. Therefore, the area efficiency of the memory chip is significantly lowered.

In view of such a circumstance, there has been proposed a flexible mapping redundancy technique in which the number of fuse sets that exceeds the assumed number of faulty cells in the entire cell array is reduced to be smaller than the total number of spare elements in a semiconductor memory device disclosed in S. Takase et al., "A 1.6-Gbyte/s DRAN with Flexible Mapping Redundancy Technique and Additional Refresh Scheme" IEEE JSSC, VOL 34, No. 11, pp. 1600–1605, November, 1999 and U.S. Pat. No. 6,188,618.

In the flexible mapping redundancy of the semiconductor memory device disclosed in U.S. Pat. No. 6,188,618, a plurality of spare elements for replacing faulty cells are arranged in a memory cell array contained in a memory chip. A fuse set contains a faulty address. The fuse set also contains mapping information indicating a correspondence between the fuse set and a spare element. In the case where a faulty address coincides with an input address, a signal for activating the corresponding spare element is outputted. There is no need to associate each fuse set with a spare element one by one.

Hereinafter, a flexible mapping redundancy technique disclosed in U.S. Pat. No. 6,188,618 will be briefly described with reference to matters related to the present invention.

In a memory cell array of the semiconductor memory device, a plurality of spare elements for saving faulty cells are disposed in a memory chip, and there are fuse sets fewer than the total number of spare elements. These fuse sets each contain a faulty address and mapping information indicating a correspondence between and the fuse set and the spare element. In the case where a faulty address coincides with an input address, an arrangement is provided so as to output a signal for activating the corresponding spare element.

FIG. 12 schematically shows a configuration of a fuse set that contains the mapping information. In a fuse set shown in FIG. 12, a fail address detector circuit (Fail Address Detector) 121 receives an address acquisition signal "strb". In the case where an input address (sometimes including address or bank address) coincides with a faulty element address, when the address acquisition signal "strb" is activated after input address determination, an address match signal "match" is activated.

A spare element selector circuit (Spare Element Selector) 122 stores in advance information on which spare element is replaced by using this fuse set, by fuse, for example. When the address match signal "match" is activated, a spare hit signal "sprhit" for selecting a spare element is outputted.

Now, a case in which the flexible mapping redundancy technique is applied to save a row will be described hereinafter. For clarity, as shown in FIG. 13, for example, assume that $8(=2^3)$ banks, i.e., bank 0 to bank 7 are arranged on a memory chip, and one bank is comprised of one cell array. However, the present invention is applicable even if one bank is comprised of a plurality of sub-cell arrays.

Assume that one bank has 512 normal word lines and 16 spare word lines, and that two word lines are units of replacement (spare elements).

In the case where a faulty element exists in a normal elements, such faulty element is replaced with a spare element, whereby a row saving is carried out.

In order to designate a faulty element, it must be specified as to which normal element is faulty, of 256 normal elements obtained by dividing the total number of word lines for one bank, 512 by the number of word lines in units of replacement, 2. When an address required for such designation is obtained, 8 bits are obtained from log (256)/log (2). On the other hand, it must be specified as to which spare element is used for replacement, of 8 spare elements obtained by dividing all of 16 spare word lines by the number of word lines in units of replacement, 2. When an address required for this designation, 3 bits are obtained from log (8)/log (2).

Therefore, it is required that each fuse set used for row saving contains a total of 15 fuses, one enable control fuse (Enable Fuse); eight faulty address designation fuses (Addresses for row decoders), three bank address designation fuses (Address for banks), and three bank spare element designation fuses (Selector for mapping spare row element within a bank).

FIG. 14 schematically shows a configuration of a fuse set used for row saving as described above.

Here, a fail address match detector 141 receives a row address acquisition signal "rstrb". In the case where a row address input "Address for row detectors" and a bank address input "Address for banks" coincide with a faulty element address, an output signal, i.e., an address match signal "match" of the fail address match detector 141 is activated when the address acquisition signal "strb" is activated after input address determination.

A decoder 142 for a spare row element selector circuit stores in advance information indicating which spare row element is used for faulty element replacement by this fuse set, for example, by fuse, "Selector for mapping spare row element within a bank". When the address match signal "match" is activated, "rron" (which denotes "row redundancy on") and sra <0:2> are outputted as spare hit signals for selecting a spare element.

FIG. 15 shows a wired OR circuit as an example of circuit for performing logical processing (wired OR) of a plurality of identical outputs for a plurality of fuse sets shown in FIG. 14.

In the figure, reference numeral 151 denotes a PMOS transistor in which a source is connected to a power supply node, a drain is connected to a wired OR output node, and a gate is supplied with a row precharge signal "rprch". Reference numeral 152 denotes a NMOS transistor in which a drain is connected to a wired OR output node, a source is connected to ground, and a gate is supplied with one bit of the signals "rron" and sra <0:2> of a corresponding fuse set.

Referring now to FIG. 14 and FIG. 15, a description will be given with respect to an operation for, in the case where inputted row address and row bank address correspond to a faulty element address, replacing such a faulty element with a spare element.

In this example, one memory chip has 8 banks, and each bank has 256 normal elements and spare elements 8. A total of 64 (8×8) spare elements are provided.

In the case where an address programmed by a fuse in one fuse set coincides with an input address, a row redundancy signal "rron" is activated, and a wired OR node signal "bRRON" is set to Low ("L"). In addition, a logic of a signal "sra <0:2> is determined depending on information on mapping fuse of this fuse set, and further, a logic of a wired OR node signal "bSRA <0:2> is determined.

When the signal "bRRON" is set to "L", a normal row decoder of a bank designated by the inputted bank address is deactivated. Then, any of eight spare elements contained in that bank is designated by 3 bits of the signal "bSRA <0:2>, and is activated.

Now, a case in which the flexible mapping redundancy technique is applied to column saving will be described here.

For example, as shown in FIG. 16, assume that 8 banks, i.e., bank 0 to bank 7 are arranged on a memory chip, each bank is divided into 8 segments, i.e., seg 0 to seg 7 in a column direction, and 4-bit data (the number of bits are arbitrarily set) is outputted from such each segment.

Each segment has 64 normal column selection lines "normal CSL". In each column cycle, one of 64 normal column selection lines "normal CSL" in each segment is activated.

Further, assume that each segment has 2 spare column selection lines "spare CSL", and a replacement element in each column is one column selection line. In the case where a replacement element (that is, one normal column selection line "normal CSL") is faulty, this faulty element is replaced with one spare element (i.e., spare column selection line "spare CSL"), whereby column saving is carried out.

Here, let us consider a case in which one normal element is faulty, and the replacement of the faulty element is made in the segment containing the faulty element. That is, let it be considered a case where one normal element is faulty, and it is needed that the faulty element is replaced with one of the two spare column select lines arranged in the segment containing the faulty element. It is required that each fuse set used for column saving contains a total of 14 fuses, one enable control fuse (Enable Fuse), six faulty address designation fuses (Address for column select line), three bank address designation fuses (Address for banks), three segment designation fuses (segment select), and one segment spare address designation fuses (Selector for mapping spare column element within each segment).

FIG. 17 schematically shows a configuration of a fuse set used for column saving as described above.

FIG. 18 shows a wired OR circuit as an example of circuit for performing logic processing of identical outputs of a plurality of fuse sets shown in FIG. 17.

In the figures, reference numeral 181 denotes a PMOS transistor in which a source is connected to a power supply node, a drain is connected to a wired OR output node, and a gate is supplied with a column precharge signal "cprch". Reference 182 denotes a NMOS transistor in which a drain is connected to a wired OR output node, a source is connected to ground, and a gate is supplied with one bit of chit <0:15> from a corresponding fuse set.

Referring now to FIG. 17 and FIG. 18, a description will be given with respect to an operation for, in the case where an inputted address corresponds to a faulty element address, replacing such faulty element with a spare element.

In this example, one memory chip has eight segments, one segment has two spare elements, and there exist a total of 16 (8×2) spare elements. In the case where an inputted column address and a column bank address correspond to a faulty element, such faulty element must be replaced with a spare element.

In the case where an address programmed address by a fuse in one fuse set coincides with an input address, column redundancy is used. Based on information on a 4-bit mapping fuse contained in this fuse set, only one of the signals "chit <0:15> is activated, and further, any one of the wired OR node signals "bSCSLE <0:15> is set to "L". This signal "bSCSLE <0:15>corresponds to 16 spare elements, and determines which spare column selection lines "spare CSL <0:15> is activated.

Of course, address match may be obtained in different fuse sets in the same column cycle. However, in that case, it is assumed that, although a plurality of signals "bSCSLE <0:15> are set to "L", a normal column selection line "normal CSL" is permitted as long as the line is replaced with a spare column selection line "spare CSL" within the same segment as the faulty "normal CSL". However, this assumption is not essential.

For example, when one signal "bSCSLE" is set to "L", the normal column decoder of the corresponding segment is deactivated. Then, activation of the normal; column selection line "normal CSL" is restricted, and either one of the two spare column selection lines "spare CSL" in that segment is activated.

In the meantime, in the semiconductor memory device disclosed in U.S. Pat. No. 6,188,618 as described above, in the case where each fuse set is applied for column saving, the maximum number enabling column saving is determined depending on the number of column fuse sets. In the case where each fuse set is applied for row saving, the maximum number enabling row saving is determined depending on the number of row fuse sets.

In the above fuse sets, conventionally, a fuse set used for row saving, and configuring a portion of a row redundancy circuit, is independent of a fuse set used for column saving, and configuring a portion of a column redundancy circuit. Thus, the number of faults enabling row saving has been independent of the number of faults enabling column saving. For example, in one memory chip, if a number of faults occur in one row, in general, such faults are handled as row faults, and row saving is carried out. If a number of faults occur in one column, in general, such faults are handled as column faults, column saving is carried out.

However, in a memory chip, the number of row faults or the number of column faults greatly depends on process, lot, wafer, or memory chip. For example, in the case where row faults are large in number, and column faults are small in number, the number of faults that can be replaced is restricted depending on the number of fuse sets for row saving. Even if an unused fuse remains in a fuse set for column saving, it has been impossible to apply this fuse to row saving. That is, there has been a problem that the degree of freedom for replacement is small, and the yields of the device are degrated.

As described above, in a conventional semiconductor memory device having a fuse set to which a flexible mapping redundancy technique is applied, a fuse set applied to row saving is independent of a fuse set applied to column set. Thus, there has been a problem that the degree of freedom for replacement is small, and the yields of the device are degraded.

BRIEF SUMMARY OF THE INVENTION

The present invention has been made in order to solve the foregoing disadvantage. It is an object of the present invention to provide a semiconductor memory device capable of achieving high replacement efficiency and high degree of freedom for replacement with a small area by applying a flexible mapping redundancy technique and sharing a storage element and a redundancy circuit for row saving and a storage element and a redundancy circuit for column saving, the semiconductor memory device comprising a redundancy system capable of contributing to improvement of yields.

According to an aspect of the present invention, there is provided a semiconductor memory device comprising: a memory cell array comprising a plurality of memory cells arranged in a plurality of rows and in a plurality of columns, the memory cell array being divided into a plurality of sub-cell arrays; a row redundancy element and a column redundancy element disposed in correspondence to each of the sub-cell arrays; a normal row decoder for selecting a row of the memory cell array according to an input address; a normal column decoder for selecting a column of the memory cell array according to an input address; a plurality of information storing circuits each storing an address of a faulty memory cell contained in each memory cell array and storing mapping information indicating a correspondence between the each storing circuit and the row redundancy element or a correspondence between the each storing circuit and the column redundancy element, the information storing circuits being adopted to output a row saving control signal for replacing the faulty memory cell with the row redundancy element or a column saving control signal for replacing the faulty memory cell with the column redundancy element based on the mapping information and a match result in the case where the address of the faulty memory cell coincides with an input address; a control circuit for deactivating the normal row decoder according to the row saving control signal supplied from the information storing circuit; a spare row decoder activated according to the row saving control signal supplied from the information storing circuit, the spare row decoder selecting the row redundancy element; a control circuit for deactivating the normal column decoder according to the column saving control signal supplied from the information storing circuit; and a spare column decoder activated according to the column saving control signal supplied from the information storing circuit, the spare column decoder selecting the column redundancy element, wherein at least one of the plurality of information storing circuits is a row/column common information storing circuit that contains a first nonvolatile storage element capable of programming information on whether row saving or column saving is carried out by using the information storing circuit, and that is selectable for use in either one of the row saving and column saving.

According to another aspect of the present invention, there is provided a semiconductor memory device comprising: a memory cell array comprising a plurality of memory cells arranged in a plurality of rows and in a plurality of columns, the memory cell array being divided into a plurality of sub-cell arrays; a row redundancy element and a column redundancy element disposed in correspondence to each of the sub-cell array, and a plurality of information storing circuits each storing an address of a faulty memory cell contained in each memory cell array and storing mapping information indicating a correspondence between the each storing circuit and the row redundancy element or a correspondence between the each storing circuit and the column redundancy element, the information storing circuits being adopted to output a row saving control signal for replacing the faulty memory cell with the row redundancy element or a column saving control signal for replacing the faulty memory cell with the column redundancy element based on the match result and the mapping information in the case where the address of the faulty memory cell coincides with an input address; wherein at least one of the plurality of information storing circuits is a row/column common information storing circuit that contains a first nonvolatile storage element capable of programming information on whether row saving or column saving is carried out by using the information storing circuit, and that is selectable for use in either one of the row saving and column saving.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 15 is an example of an output side circuit configuration of a plurality of row saving fuse sets shown in FIG. 14;

Figure 16:
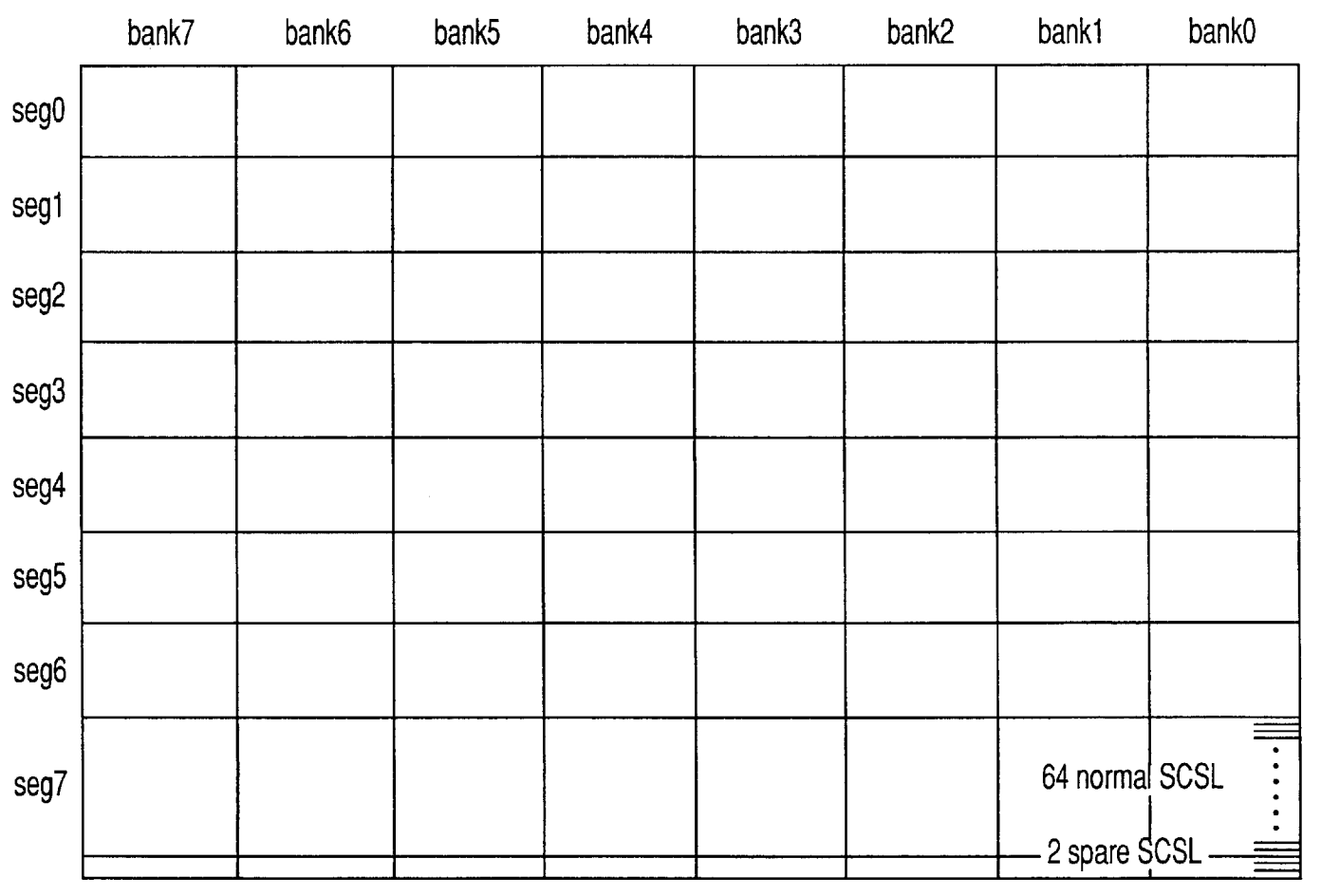

FIG. 16 is an example of a configuration in a column direction in the conventional memory chip;

DETAILED DESCRIPTION OF THE INVENTION

Hereinafter, preferred embodiments of the present invention will be described with reference to the accompanying drawings. First, an outline of DRAM according to a first embodiment will be described hereinafter.

The DRAM according to the first embodiment is primarily featured in that: there are provided a row saving circuit and a column saving circuit; there are provided a plurality of fuse sets to which a flexible mapping redundancy technique is applied; and as at least one (all in the present embodiment) of the plurality of fuse sets, there is used a row/column common replacement fuse set (row/column fuse set) capable of selecting one of row saving and column saving, i.e., capable of selectively using one of the row and column. In order to determine whether this row/column common saving fuse set is used for row saving or column saving, the saving fuse set contains a nonvolatile storage element (fuse in the present embodiment) having its function similar to a storage element or the like for storing a faulty address.

In this way, a plurality of fuse sets to which a flexible mapping redundancy technique is applied are provided, and thus, the number of memory cell saving control circuits containing redundancy memory cells required for replacement of a faulty memory cell and a nonvolatile storage element is reduced, thereby making it possible to improve efficiency of an area occupied by a memory chip required for the redundancy circuit.

In addition, an attempt is made to share the row saving fuse and redundancy circuit and the column saving fuse and redundancy circuits. Thus, in the case of a number of row faults occur, a number of the fuse sets are allocated for column saving, whereby one row/column common saving fuse set can be desirably used for row saving and column saving. As a result, high saving efficiency and degree of freedom for saving can be achieved in a small area, thus making it possible to contribute to improvement of the yields of the device.

Figure 1:
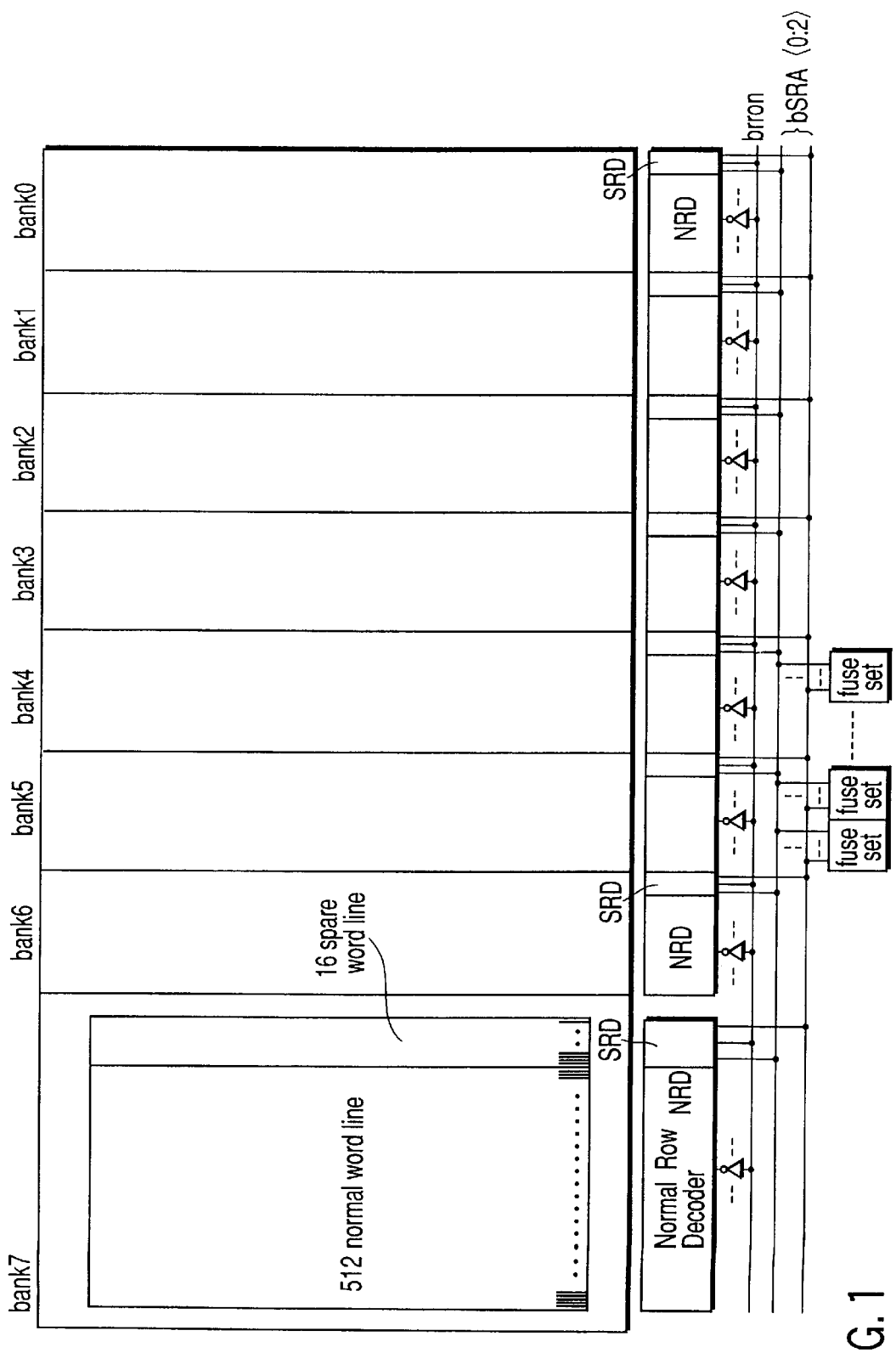
FIG. 1 is a schematic diagram of a DRAM bank configuration according to a first embodiment of the present invention.
Figure 2:
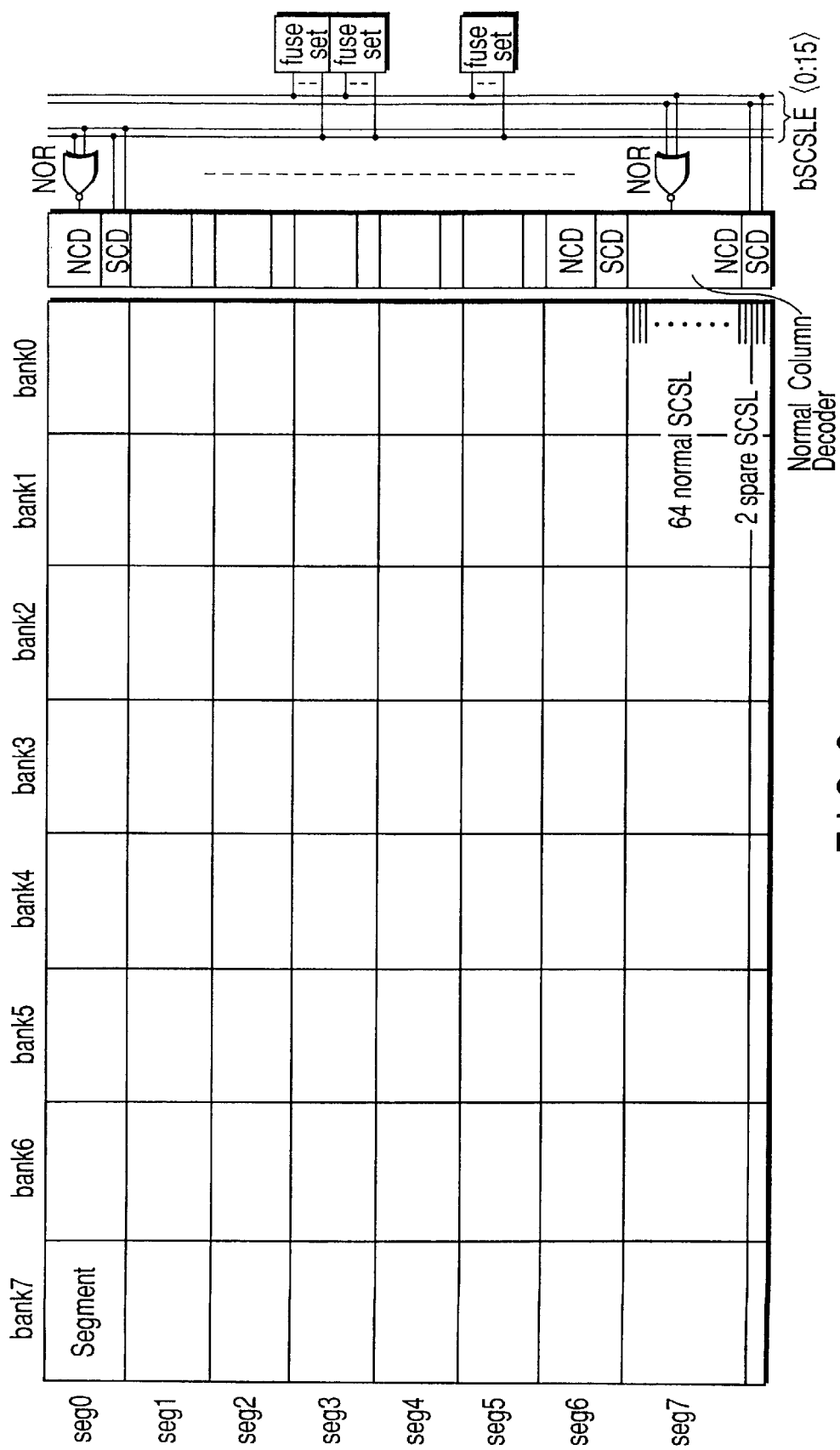
FIG. 2 is a schematic diagram of a DRAM segment configuration according to the first embodiment of the present invention.

FIG. 1 and FIG. 2 schematically show a bank configuration and a segment configuration of a dynamic random access memory (DRAM) according to the first embodiment of the present invention, respectively.

The memory cell array is divided in a matrix shape in which 8 rows are in the row direction, and 8 columns are in the column direction, wherein each divided unit is called a segment (subarray). 8 segments in each row configures bank 0 to bank 7, and a segment array comprising 8 segments in each column is referred to as seg 0 to seg 7.

Each segment contains a plurality of word lines, a plurality of dummy word lines (not shown), and a plurality of bit line pairs orthogonal to these word lines. A memory cell (not shown) is provided at each crossing portion between a word line and a bit line pair, and a dummy cell (not shown) is provided at each crossing portion between a dummy word line and a bit line pair.

Banks 0 to 7 each are configured so as to be successively activated. After one bank is activated, another bank can be accessed before being precharged (before entering a standby state). Thus, it is impossible to collectively provide spare elements available for use in common over the banks so as to save memory cell faults of any bank. Spare elements are provided for each bank. In addition, an arrangement is made so as to latch a selection state of the row decoder that corresponds to a selected bank, and hold this state until a precharge command has been issued to the bank.

As shown in FIG. 1, banks 0 to 7 each have 512 normal word lines, for example, disposed in a row direction in order to select a normal element, and have 16 spare word lines, for example, for selecting a column redundancy element (spare element). A replacement unit for row saving (the number of replacement elements) is two word lines, for example.

In correspondence to this arrangement, 256 normal row decoders NRD and eight spare row decoders SRD disposed adjacent to the normal row decoders are provided at one end in the row direction of each of bank 0 to bank 7. One normal row decoder NRD selects two normal word lines, and one spare row decoder selects two spare word lines.

In the case where a normal element (including two normal word lines in the present embodiment) is faulty, such faulty element is replaced with spare elements in a bank having such faulty element contained therein (that is, two spare word lines in a bank having such faulty element contained therein), wherein row saving is carried out. Namely, a spare row decoder SRD provided in correspondence to the bank having such faulty element contained therein is used in place of the normal row decoder NRD provided in correspondence to the bank having such faulty element contained therein, whereby row saving is carried out.

In the above row saving, an address required to designate a faulty element in one bank contains an address required to designate a faulty address and a bank address. The address required to designate the faulty address is obtained as 8 bits from log (256)/log (2), and the address required to designate the bank address is obtained as 3 bits. In addition, an address required to designate which of eight spare elements in the bank is used in place of a faulty element is obtained as 3 bits.

On the other hand, as shown in FIG. 2, segment arrays "seg 0" to "seg 7" each have 64 normal column selection lines "normal CSL", for example, successively disposed in a column direction in order to select a normal element, and have two spare column selection lines "spare CSL" for spare element selection disposed adjacent to these normal column selection lines. A replacement unit for column saving is one column selection line, for example. One column selection line is provided in correspondence to a pair of bit lines, for example.

In correspondence to this arrangement, 64 normal column decoders NCD and two spare column decoders SCD disposed adjacent to these normal column decoders are provided at one end in the column direction of each segment array. 16 spare column decoders SCD are provided as a whole in the memory cell array.

In addition, at each side in the column selection line direction of each segment, there are provided: a sense amplifier for amplifying data read out from a memory cell of a selected row to a bit line of a normal element; a normal column switch (not shown) inserted between this sense amplifier and a data line and selected by an output of the normal column decoder NCD; a sense amplifier for amplifying data read out from a memory cell of a selected row to a bit line of a spare element; and a spare column switch (not shown) inserted between this sense amplifier and a data line and selected by an output of the spare column decoder SCD. The above sense amplifier may be in accordance with a so called shared sense amplifier system shared by the adjacent sub-cell arrays, and may be provided independently for each sub-array.

In the case a normal element (one normal column selection line "normal CSL" in the present embodiment) is faulty, one spare element in a segment having such faulty element contained therein (that is, one spare column selection line "spare CSL") is used in place of such faulty element, whereby column saving is carried out. Namely, a spare column decoder SCD provided in correspondence to a segment array having such faulty element contained therein is used in place of a normal column decoder NCD provided in correspondence to a segment array having such faulty element contained therein, whereby columns saving is carried out.

In the above column saving, an address required to designate a faulty element in one segment contains an address required to designate a faulty address. The address required to designate the faulty address is obtained as 6 bits from log (64)/log (2), the address required to designate a bank address is obtained as 3 bits, and the address required to designate a segment is obtained as 3 bits. In addition, an address required to designate which of the two spare elements in the segment is used in place of a faulty element is obtained as 1 bit.

In the DRAM shown in FIG. 1 and FIG. 2, a plurality of fuse sets to which the previously described flexible mapping redundancy technique is applied are provided as a nonvolatile storage circuit for storing a faulty address or the like required to carry out column saving, as described above. The number of fuse sets is fewer than the number of banks×the number of segment arrays×the number of spare elements in a segment. The fuse sets are provided in number so as to sufficiently exceed the average number of faulty cells in the entire cell array. In the present embodiment, as all the fuse sets, there is provided a row/column common fuse set that can be selected for one of the fuse sets for row saving and column saving.

Figure 3:
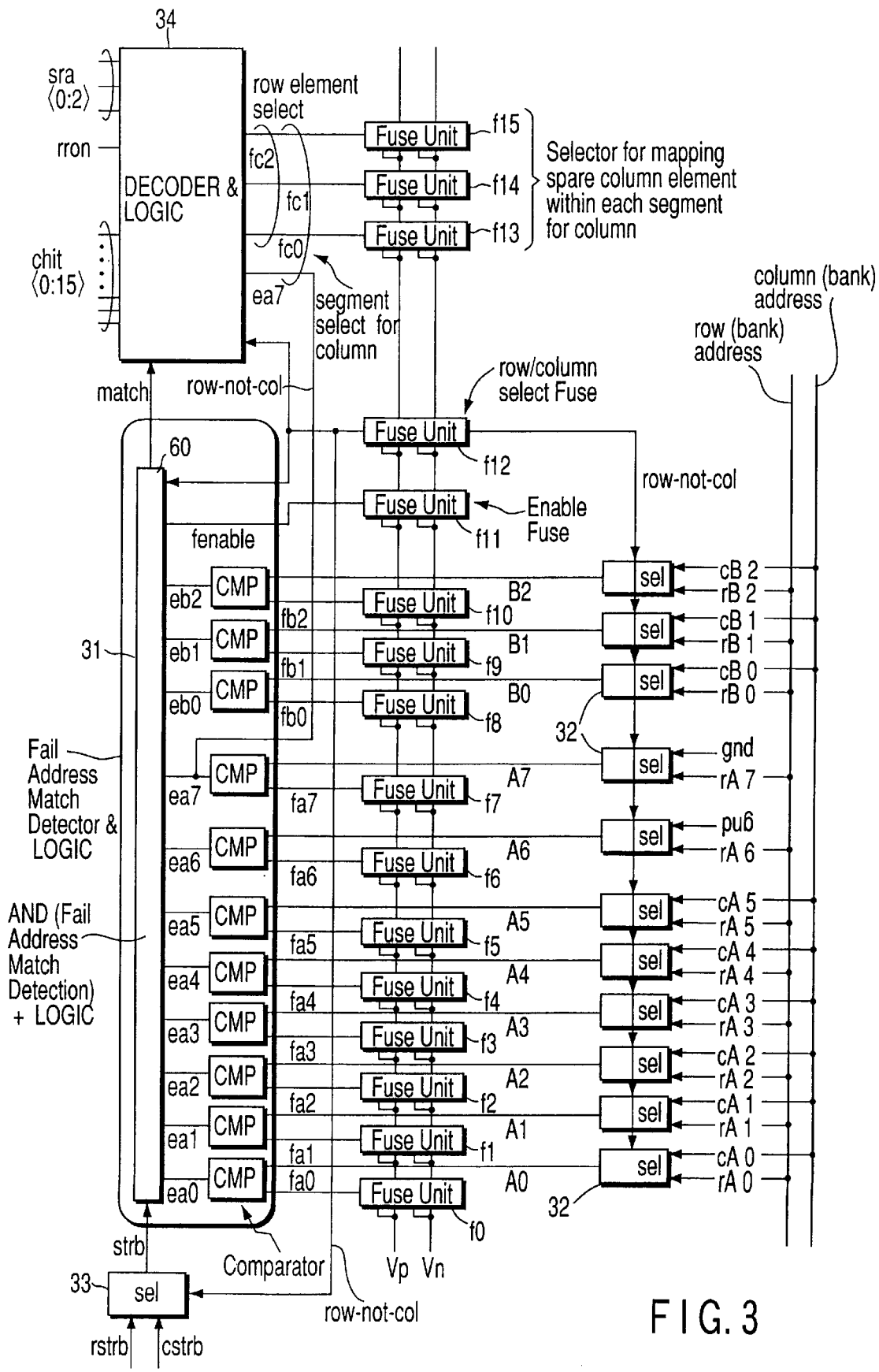
FIG. 3 is a detailed configuration of one of row/column common saving fuse sets used in the configuration of FIG. 2.

FIG. 3 shows one of the row/column common saving fuse sets used in the configurations shown in FIG. 1 and FIG. 2.

Figure 14:
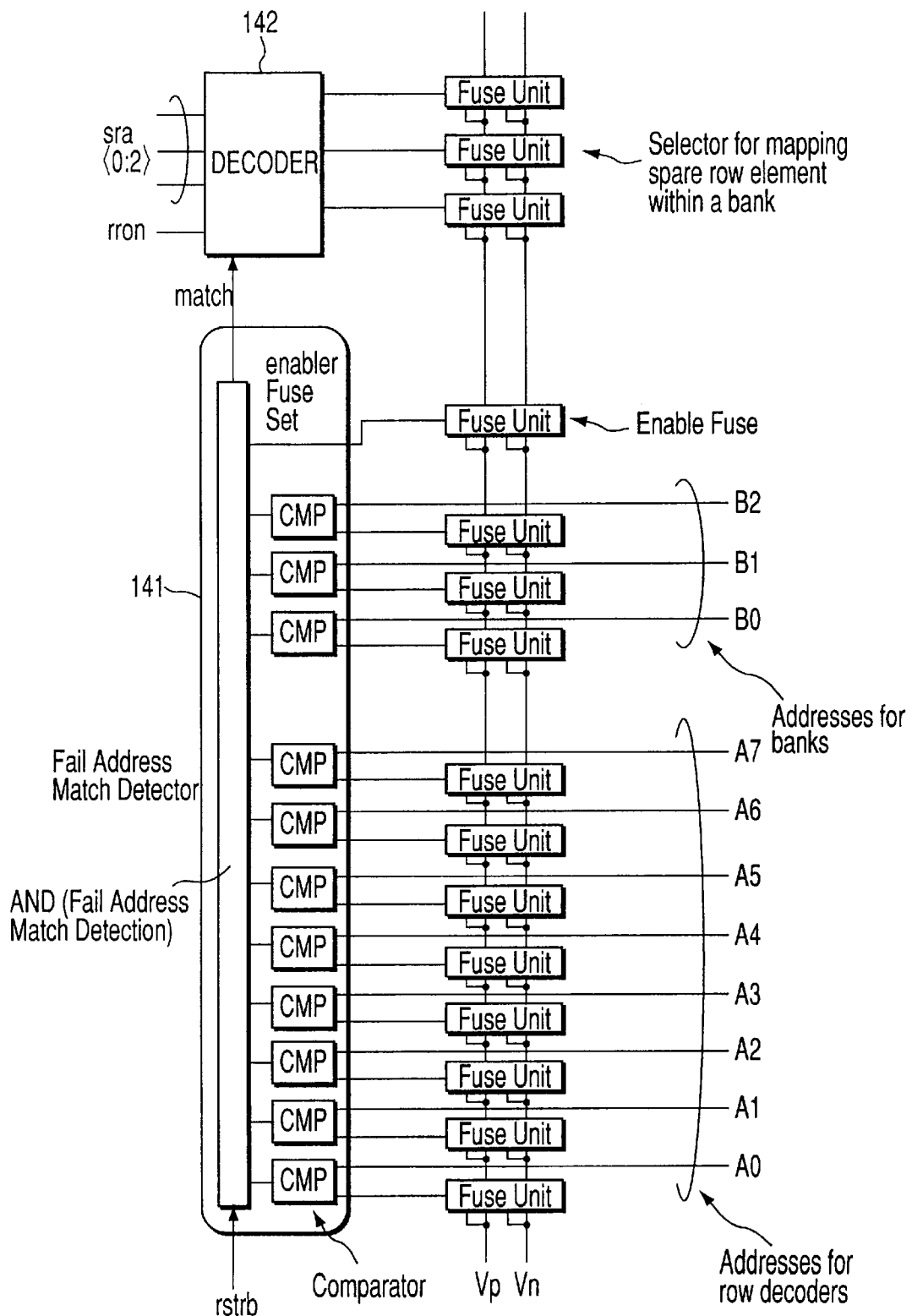
FIG. 14 is an example of configuration of row saving fuse sets in the conventional memory chip.
Figure 17:
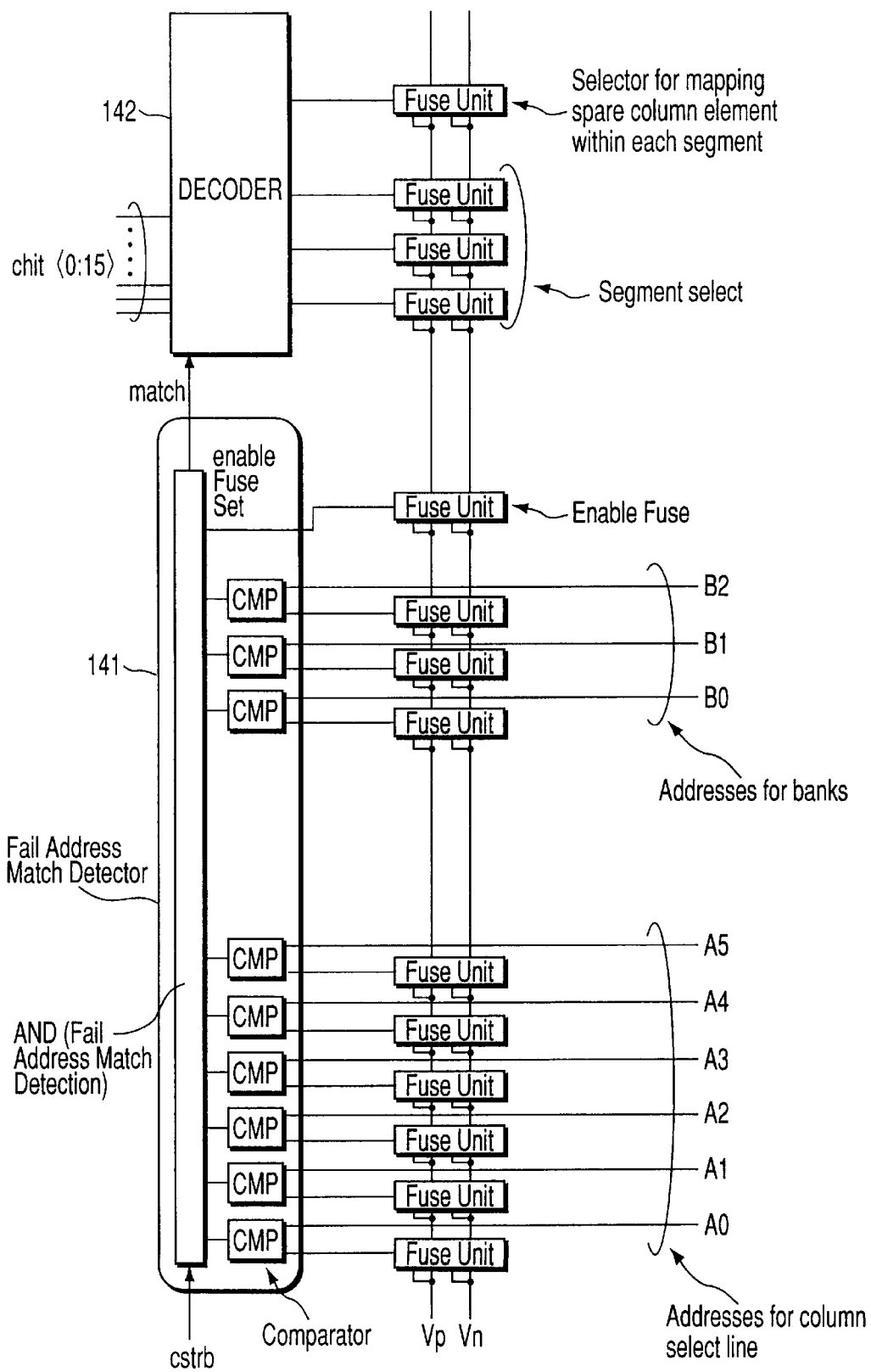
FIG. 17 is an example of configuration of column saving fuse sets in the conventional memory chip.
Figure 18:
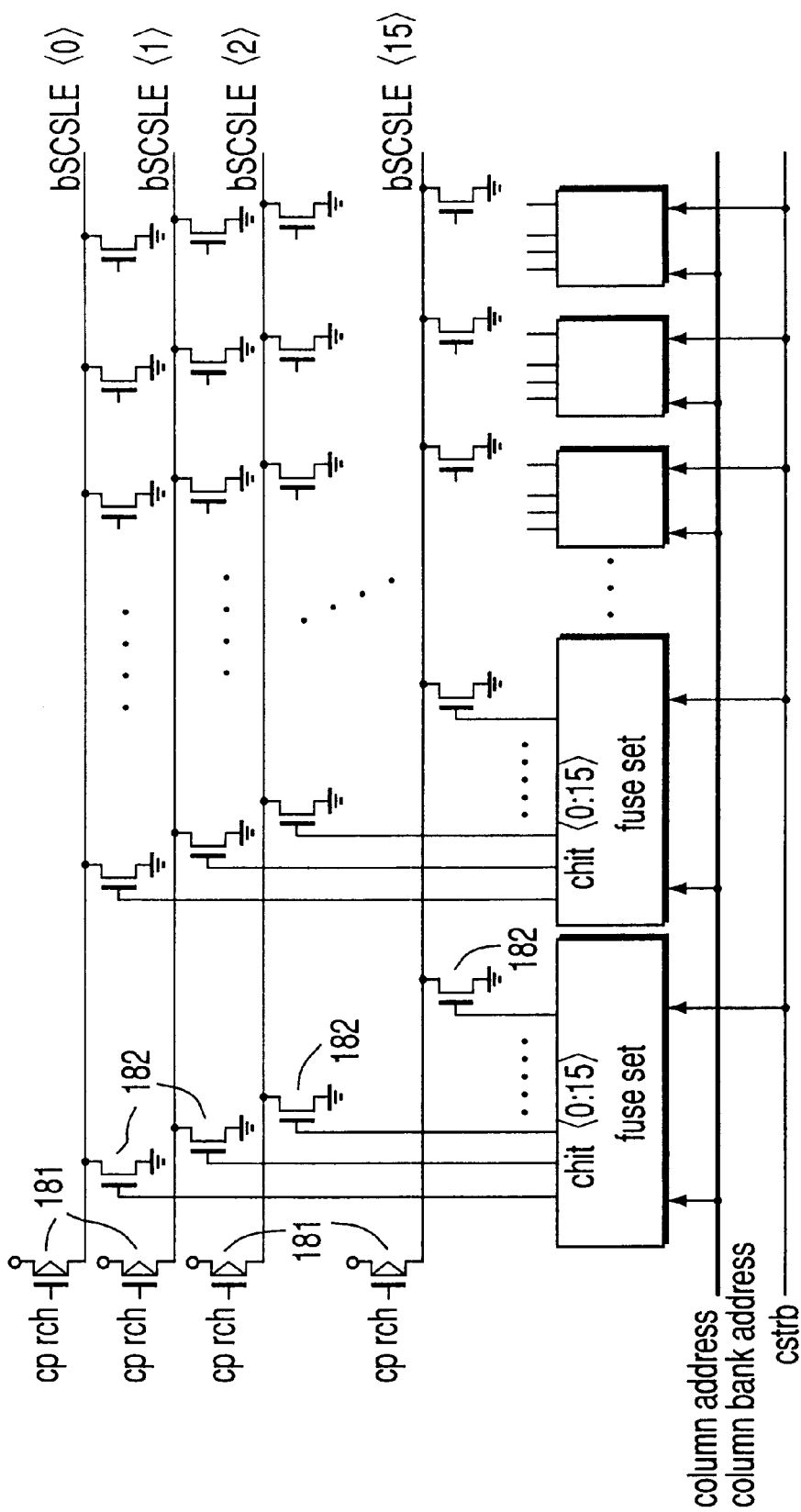
FIG. 18 is an example of an output side circuit configuration of a plurality of column saving fuse sets shown in FIG. 17.

This row/column common fuse set is different from a conventional row specific fuse set shown in FIG. 14 or a conventional column specific fuse set shown in FIG. 17 in that:

(a) one row/column select fuse is added in order to enable selection of whether a fuse set is used for row saving or column saving.

In the case where this row/column select fuse is disconnected, the output signal "row not col" is set to "H", and this fuse set is set for row saving. In contrast, in the case where the fuse is not disconnected, the output signal "row not col" is set to "L", and this fuse set is set for column saving. Namely, it is possible to selectively set the fuse set to either of a row saving circuit and a column saving circuit according to whether this row/column select fuse is disconnected or not.

(b) The row/column common fuse set controls an operation of a fail address match detector & logic circuit (Fail Address Match Detector & LOGIC) 31, an input of a group of address input/selector circuits (sel) 32 (row or column saving), an input of address acquisition signal input/selector circuit (sel) 33 (row or column saving), and an operation of a decoder & logic circuit (DECODER & LOGIC) 34 so as to be switched according to an output signal "row not col" of the row/column select fuse.

The total number of fuses configuring the fuse set in FIG. 3 is 16, which contains: one enable control fuse (Enable Fuse); one row/column select fuse (row/column select Fuse); one row address 0 or column address 0 fuse; one row address 1 or column address 1 fuse; one row address 2 or column address 2 fuse; one row address 3 or column address 3 fuse; one row address 4 or column address 4 fuse; one row address 5 or column address 5 fuse; one row address 6 or unused fuse; one row address 7 or spare address designation fuse; one row bank address 0 or column bank address 0 fuse; one row bank address 1 or column bank address 1 fuse; one row bank address 2 or column bank address 2 fuse; three spare element designation or segment designation fuses.

That is, a fuse set shown in FIG. 3 stores a faulty memory cell address, and information on a correspondence between the fuse set and eight spare row decoders SRD or information on a correspondence between the fuse set and the 8 segments.

In addition, to this fuse set, there are connected: one replacement control line "rron" for outputting a replacement control signal while a faulty element is replaced with a spare element; a spare row decoder selection line "sra <0:2> for outputting a selection signal for selecting one of eight spare row decoders; 16 spare column selection line "chit <0:15>, one of which is set to level "H".

Figure 4:
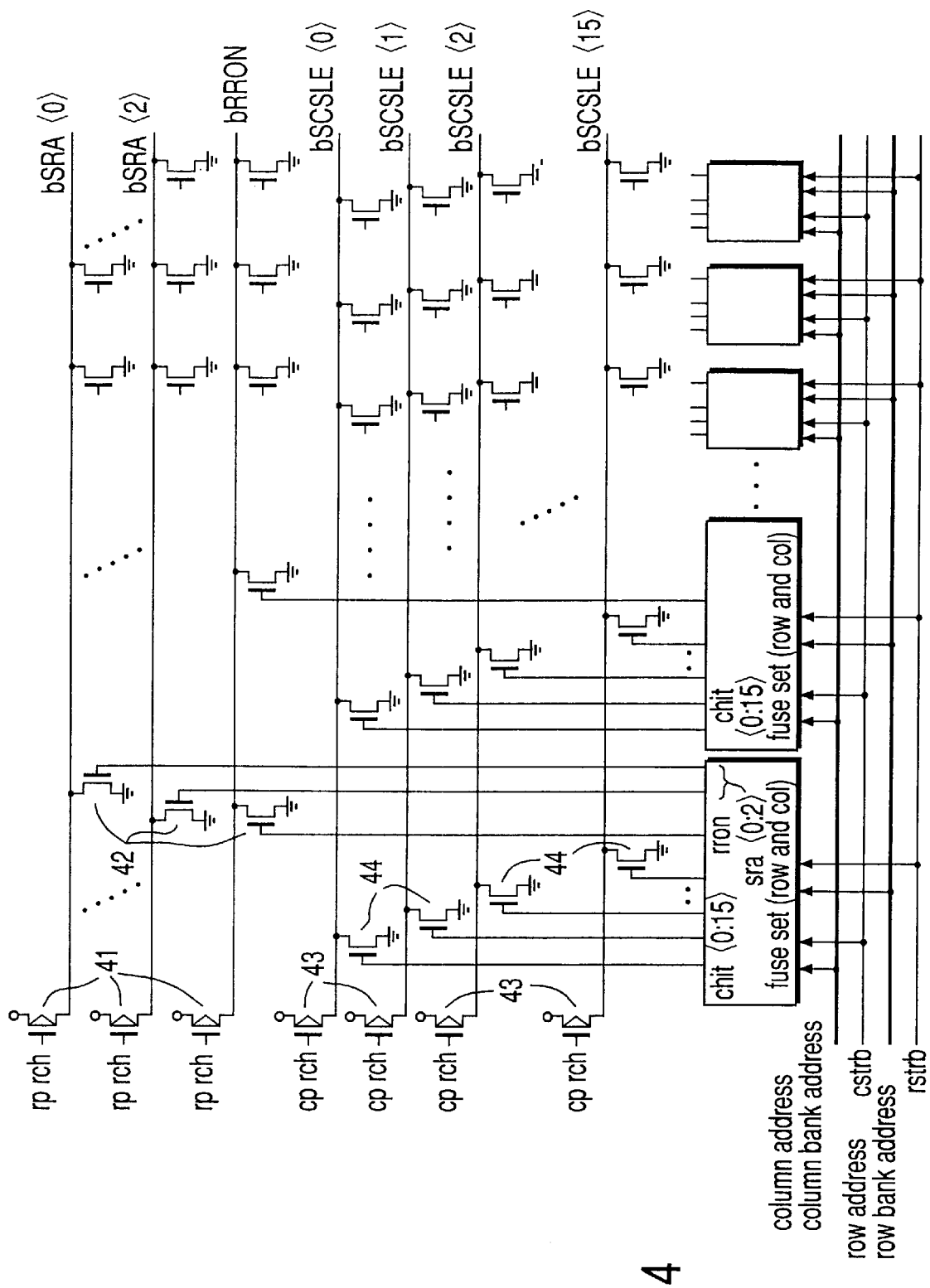
FIG. 4 is a diagram of a wired OR circuit as an example of a circuit for performing logic processing of the same outputs of a plurality of the row/column common saving fuse sets shown in FIG. 3.

FIG. 4 shows a wired OR circuit as an example of circuit for logically processing an output of all the fuse sets shown in FIG. 1.

In the figure, reference number 41 denotes a PMOS transistor in which a source is connected to a power supply node, a drain is connected to a wired OR output node, and a row precharge signal "rprch" is applied to a gate. Reference 42 denotes an NMOS transistor in which a drain is connected to a wired OR output node, a source is connected to ground, and a gate is supplied with one bit of the signal "rron", sra <0:2> from a corresponding fuse set.

Reference numeral 43 denotes a PMOS transistor in which a source is connected to a power supply node, a drain is connected to a wired OR node, and a gate is supplied with a column precharge signal "cprch". Reference numeral 44 denotes an NMOS transistor in which a drain is connected to a wired OR output node, a source is connected to ground, and a gate is supplied with one bit of chit <0:15> from the corresponding fuse set.

For the purpose of clarity, the wired OR circuit shown in FIG. 4 is omitted in FIG. 1.

Now, operations of the fuse set shown in FIG. 3 and the circuit shown in FIG. 4 will be briefly described hereinafter.

The fuse set shown in FIG. 3 compares an input address supplied from the outside with a faulty address that is stored in advance, and outputs a replacement control signal when detecting a coincidence. In the case where this fuse set is set for row saving, a row saving replacement control signal "rron" is outputted, and at the same time, a spare row selection signal "sra <0:2> for designating a correspondence between the fuse set and eight spare row decoders of each bank is outputted.

As shown in FIG. 4, a wired OR logic of row saving control signals "rron" of each fuse set is obtained, and the resulting signal is outputted to a row saving control line "bRRON". Signals of this row saving control line "bRRON" are directly inputted to eight spare row decoders "SRD" of each bank as shown in FIG. 1, the inputted signals are inverted by means of inverter IV, respectively, and the inverted signals are inputted to 64 normal row decoders NRD. The signals of the row saving control line "bRRON" are thus inputted, whereby the row saving control signal "rron" enters an active state "H". Otherwise, a normal row decoder that should have been selected by an external address is deactivated, and, on the other hand, a spare row decoder SRD is activated. In addition, a wired OR logic of the spare row selection signals sra <0:2> of each fuse set is obtained, and the resulting signal is outputted to three spare row decoder selection control line "bSRA <0:2>. By decoding this output, one of eight spare row decoders SRD of each bank is selected, and one spare element is selected.

In contrast, in the case where the fuse set is set for column saving, a spare column selection signal "chit <0:15> for selecting one of 16 spare column selection lines is outputted as a column saving control signal. As shown in FIG. 4, a wired OR logic of the signals each corresponding to the spare column selection signals "chit <0:15> of each fuse set is obtained, and the resulting signal is outputted to the spare column selection line "bSCSLE <0:15>. Of these spare column selection lines "nSCSLE <0:15>, the signals of the two spare column selection lines "nSCSLE <0:1> that correspond to a first segment array "seg 0" is ORed by a NOR circuit NOR, is inverted, and then, inputted to the normal column decoder NCD. The thus ORed inverted signal is inputted, whereby either of these two spare column selection lines bSCSLE <0:1> enters an active state "H". Otherwise, the normal column decoder NCD that corresponds to the first segment array "seg 0" which should have been selected by an external address is deactivated.

Hereinafter, similarly to the above, signals of two spare column selection lines bSCSLE <2:3> to <15:16> that correspond to the second to eighth segment arrays "seg 1" to "seg 7" are ORed by the NOR circuit NOR, and are inverted, and then inputted to the normal column decoders NCD that correspond to the second to eighth segment arrays "seg 1" to "seg 7". The thus ORed inverted signal is inputted, whereby either of these spare column selection lines "bSCSLE <2:3> to <15:16> enters an active state "H". Otherwise, the normal column decoders NCD that correspond to second and eighth segment arrays "seg 1" to "seg 7" which should have been selected by an external address are deactivated.

As is evident from the above description of operation, in the row/column common saving fuse set shown in FIG. 3, it is possible to use whether this fuse set is used as a row saving circuit or a column saving circuit according to whether one fuse "row/column Fuse" is disconnected or not. That is, in the row/column common saving fuse set shown in FIG. 3, it is possible to select whether this fuse set is used as a row saving circuit or a column saving circuit according to whether one fuse "row/column select Fuse" is disconnected or not. Moreover, each fuse set stores a faulty memory cell address and information (mapping information) on a correspondence between the fuse set and eight spare row decoders SRD or information (mapping information) on a correspondence between the fuse set and 16 spare column selection lines. Each fuse set can be associated with a spare element based on this mapping information. In this manner, there is no need to provide each fuse set in correspondence to a spare element one by one. Even in the case where faults are distributed uniformly or in the case where faults collectively exist due to fuse sets in number fewer than the total number of spare elements, such faulty fuse can be flexibly replaced with the replacement fuse.

The number of address designation fuses increases or decreases according to the segment capacity and bank capacity, and the number of mapping fuses increases or decreases according to the number of segment arrays and the number of banks. A plurality of enable fuses can be provided.

In addition, the row saving circuit and column saving circuit are substantially independent of each other. In the present embodiment, there is shown a case in which the number of fuses used for row saving in a fuse set is different from the number of fuses used for column saving. An arrangement may be simpler than that in the present embodiment depending on a relationship between the number of fuses used for row saving and the number of fuses used for column saving. In the case where a saving function has been expanded, an arrangement may be more complicate than that in the present embodiment.

Now, a row/column common saving fuse set shown in FIG. 3 will be described in more detail.

In this fuse set, 11 fuse units f0 to f10 of 16 fuse units f0 to f15 are adopted to store information (including bank information) for designating a faulty address of a memory cell. One fuse f11 is provided as an Enable Fuse for storing flag information representing whether or not to use the fuse set.

One fuse unit f12 is provided as a row/column select fuse for storing information for designating whether this fuse set is used for row saving or column saving.

Three fuse units f13 to f15 are adopted to store mapping information.

Eight fuse units f0 to f7 of 11 fuse units f0 to f10 for storing the faulty address designation information are different in their roles depending on whether this fuse set is used for row saving or column saving, and the remaining three fuse units f8 to f10 store information for selecting eight banks, i.e., bank 0 to bank 7.

That is, in the case where this fuse set is used for row saving, eight fuse units f0 to f7 each designate a faulty memory cell address and information for designating a correspondence between the fuse set and each of 256 normal row decoders NRD of each bank. In the case where this fuse set is used for column saving, six fuse units f0 to f5 each store a faulty memory cell address and information for designating a correspondence between the fuse set and each of the 64 normal column decoders NCD of each segment.

Three fuse units f13 to f15 for the mapping information storage are different in their roles depending on whether this fuse set is used for row saving or column saving. That is, in the case where this fuse set is used for row saving, it is designated which of eight spare row decoders SRD of each bank is used to associate this fuse set with. In the case where this fuse set is used for column saving, it is designated which of 16 spare column selection lines is used to associate this fuse set with.

Figure 5:
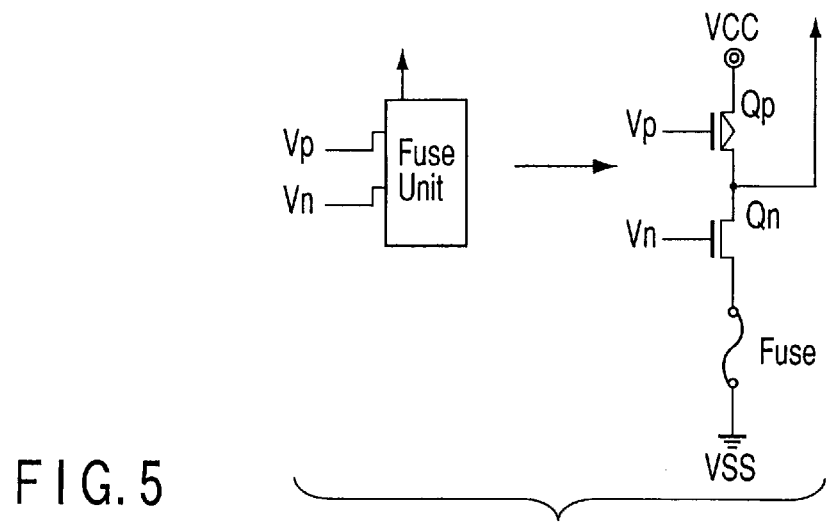
FIG. 5 is a detailed configuration of one of fuse units in the fuse sets shown in FIG. 3.

The fuse units f0 to f15 each are configured as shown in FIG. 5, for example. To these fuse units each, a precharge PMOS transistor Qp, selection NMOS transistor Qn, and a fuse Fuse are connected in series between a power supply (Vcc) node and a grounding (Vss) node.

Then, storage information (fuse data) on individual fuses "Fuse" is read out while the PMOS transistor Qp is turned OFF, and the NMOS transistor Qn is turned ON after the PMOS transistor Qp has been turned ON, the NMOS transistor Qn has been turned ON and precharged. At this time, when the fuse "Fuse" is turned OFF, the level "H" is outputted. When the fuse "Fuse" is not turned OFF, the level "L" is outputted.

Figure 6:
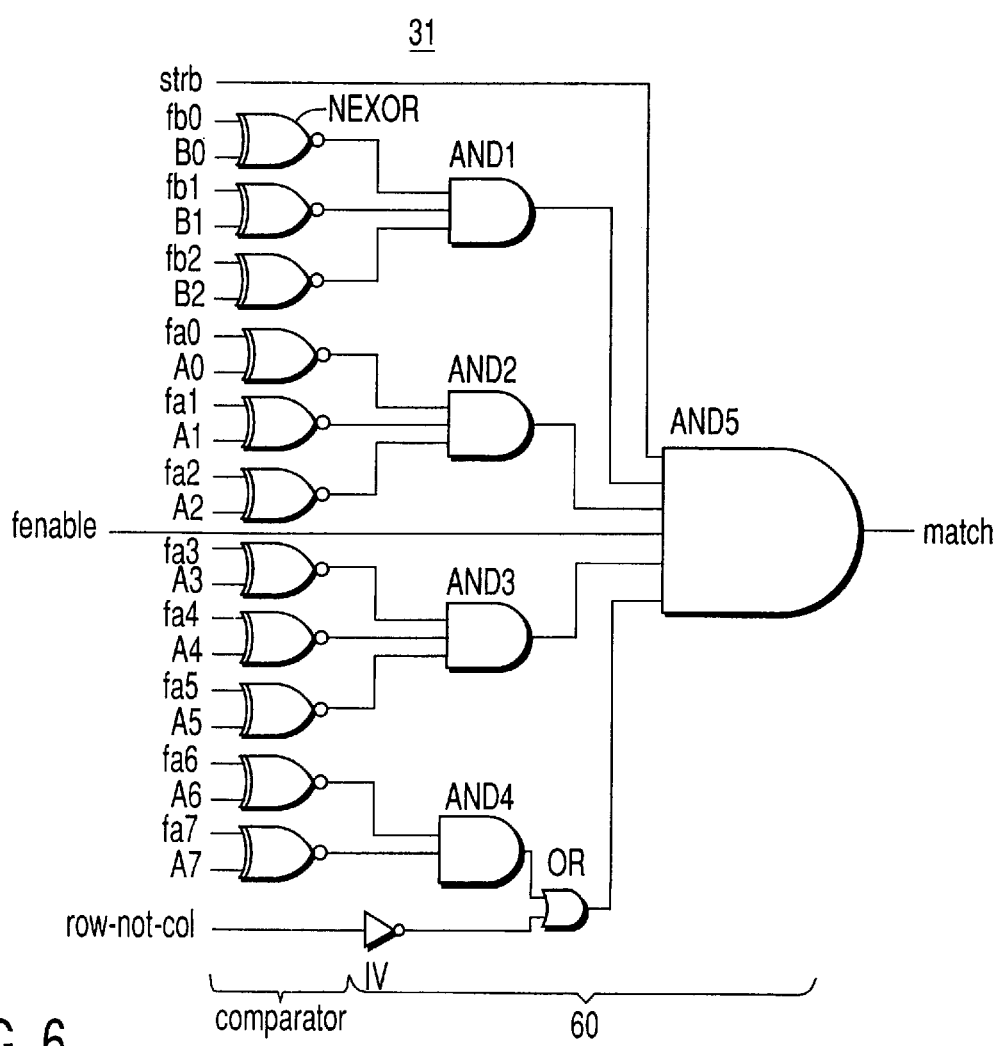
FIG. 6 is a circuit diagram of an example of a fail address match detector & logic circuit (Fail Address Match Detector & LOGIC) in the fuse sets shown in FIG. 3.

FIG. 6 shows an example of detailed configuration of a fail address match detector & logic circuit (Fail Address Match Detector & LOGIC) 31 in a fuse set shown in FIG. 3.

In the circuit, 11 comparators CMP (exclusive NOR gate NEXOR) each configure an address match detector circuit. The fuse data read out from the 11 fuse units f0 to f10 and each bit signal of the address input (11 bits for row saving and 10 bits and fixed level 1 bit for column saving) are inputted, respectively, to 11 corresponding comparators CMP (exclusive NOR gate NEXOR). A plurality of output signals of this address match detector circuit, an output signal "fenable" of an Enable Fuse, an output signal "row not col" of a row/column select fuse, and a strobe signal "strb" are supplied to an AND gate & logic circuit 60. The AND gate & logic circuit 60 comprises: one AND gate AND 1 for obtaining the logical product of the outputs of three exclusive NOR gates that correspond to three fuse units f8 to f10, respectively in 11 exclusive NOR gates NEXOR; one AND gate AND 2 for obtaining the logical product of outputs of three exclusive NOR gates that correspond to three fuse units f0 to f2, respectively; one AND gate AND 3 for obtaining the logical product of outputs of three exclusive NOR gates that correspond to three fuse units f3 to f5, respectively; one AND gate AND 4 for obtaining the logical product of outputs of two exclusive NOR gates that correspond to the remaining two fuse units f6 and f7 each in 11 exclusive NOR gates NEXOR; an inverter circuit IV having an output signal "row not col" of the row/column select fuse inputted thereto; one OR gate OR having outputs of this inverter circuit IV and outputs of the AND gate AND 4 inputted thereto; and one AND gate AND 5 having outputs of the OR gate OR and the three AND gates AND 1 to AND 3 and the strobe signal "strb" and signal "fenable" inputted thereto.

With such a logic configuration, in the case where the fuse set shown in FIG. 3 is placed in an Enable state, and an address coincidence has been detected, a signal "match" (Enable signal for carrying out faulty cell replacement) indicating that an address input coincides with information stored in a fuse is outputted from an AND gate & logic circuit 60 with a timing of a strobe signal "strb".

Figure 7:
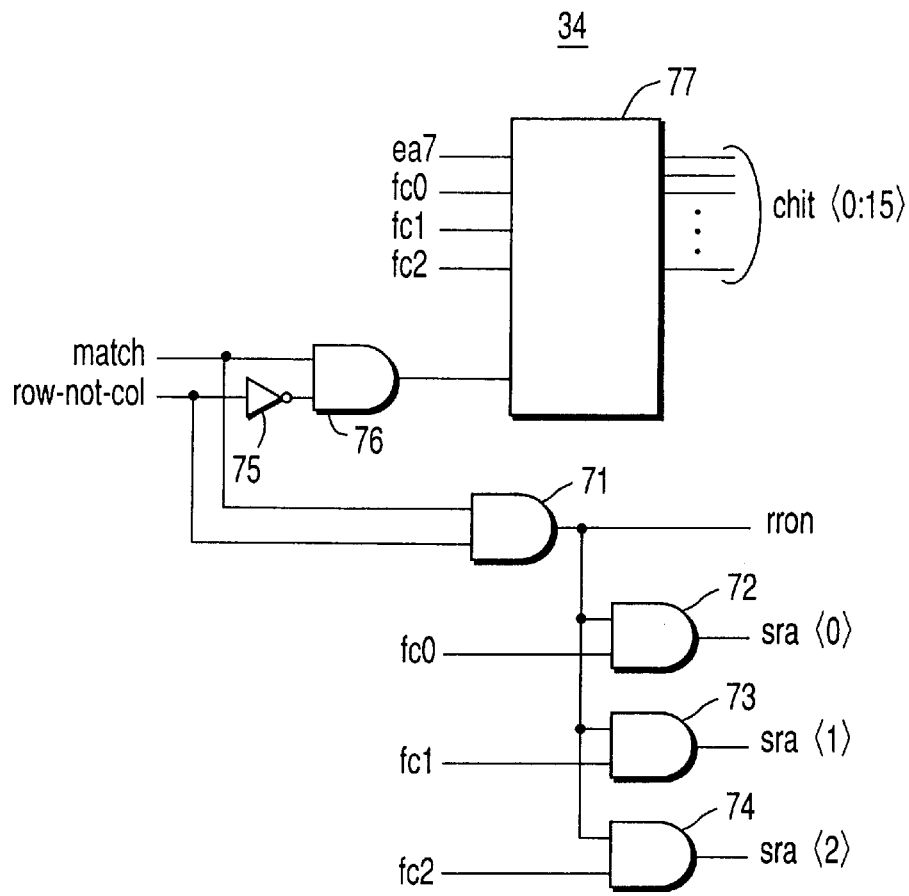
FIG. 7 is a circuit diagram of an example of a detailed configuration of a decoder & logic circuit (DECODER & LOGIC) in the fuse sets shown in FIG. 3.

FIG. 7 shows an example of a detailed configuration of the decoder & logic circuit 'DECODER & LOGIC) 34 in the fuse set shown in FIG. 3.

This circuit comprises a row saving circuit portion and a column saving circuit portion. The row saving circuit portion comprises: an AND gate 71 having the output signal "row not col" of the row/column select fuse and the signal "Match" inputted thereto; and three AND gates 72 to 74 to which an output of the AND gate 71 is inputted and fuse data (mapping information) on the fuse units f13 to f15 are inputted, respectively.

In contrast, the column saving circuit portion comprises: an inverter circuit 75 having an output signal "row not col" of the row/column select fuse f12 inputted thereto; an AND gate 76 having an output of the inverter circuit 75 and the signal "Match" inputted thereto; a decoder 77, which is activated by the AND gate 76, having inputted thereto an output "ea7" of a comparator NEXOR corresponding to the fuse unit f7, of the fuse data (mapping information) on the fuse units f13 to f15 and the address match detector circuit.

The signal "Match" is an Enable signal for carrying out faulty cell replacement. When the signal "Match" is inputted, the row saving circuit portion and the column saving circuit portion are activated. In the case where an output signal "row not col" of the row/column select fuse f12 is set to "H" (that is, in the case of row saving), a replacement control signal "rron" for row saving is outputted from the row saving circuit portion, and the spare row decoder SRD and normal row decoder NRD are controlled to be activated or deactivated, respectively. On the other hand, the fuse data (mapping information) on the fuse units f13 to f15 is outputted to three spare row decoder input lines, thereby selecting one of eight spare row decoders SRD of a bank.

In contrast, in the case where the output signal "row not col" of the row/column select fuse is set to "L" (that is, in the case of column saving), an output signal of an AND gate 76 is set to "H", and a decoder 77 is activated at the column saving circuit portion. Then, an output "ea7" of the comparator NEXOR that corresponds to the fuse unit f7 of the fuse data (mapping information) of the fuse units f13 to f15 and the address match detector circuit is decoded by means of the decoder 77, and one of 16 spare column selection lines is set to "H", and is selected.

Figure 8:
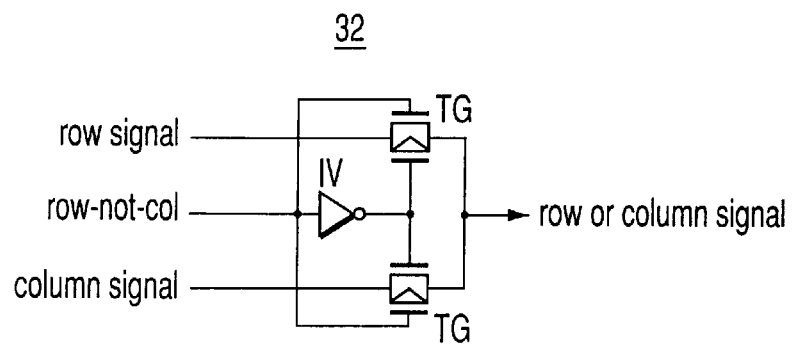
FIG. 8 is a circuit diagram of an example of a detailed configuration by sampling a selector "sel" circuit in fuse sets shown in FIG. 3.

FIG. 8 shows a detailed configuration of one of a plurality of address input/selector circuits (sel) 32 in a fuse set shown in FIG. 3.

This circuit has two transfer gates TG in which a row address signal "row signal" is inputted to one terminal of one of the transistor gates TG and a column address signal "column signal" is inputted to one terminal of the other of the transistor gates TG, and the other terminal of said one transistor gate TG is connected to the other terminal of said other transistor gate TG. The two transfer gates TG are complementarily switch controlled in accordance with the output signal "row not col" of the row/column select fuse f12 and a signal obtained by inverting the output signal by means of the inverter circuit IV. In this manner, the row address signal "row signal" or column address signal "column signal" are outputted as an output signal "row or column signal" from a common connection node of the two transfer gates TG.

An address acquisition signal input/selector circuit (sel) 33 in a fuse set shown in FIG. 3 is also configured in the same way as the above address input/selector circuit 32. In association with the two transfer gates TG, a row strobe signal "rstrn" is inputted in place of the row address signal "row signal" in FIG. 8; a column strobe signal "cstrb" is inputted in place of the column address signal "column signal"; and the signal "rstrb" or the signal "csrtb" is outputted according to the logic level of the output signal "row not col" of the row/column select fuse.

Now, a replacement operation using the circuit shown in FIG. 1 to FIG. 4 will be described in detail.

First, a description will be given with respect to an operation for, in the case where all the fuse sets are used for row saving or in the case where the inputted row address and row bank address correspond to faulty element addresses, replacing such faulty element with a spare element.

In the present embodiment, one memory chip has eight banks. Each bank has 256 normal elements and eight spare elements. A total of 64 (8×8) spare elements are arranged in the memory chip.

In each fuse set, in the case where the input address coincides with an address programmed by a fuse, a replacement control signal "rron" (denotes "row redundancy on") representing that row saving is carried out is activated, and a signal line "bRRON" connected to a wired OR node is set to "L". In addition, depending on the information on mapping fuses f13 to f15 of this fuse set, a logic of a signal "sra <0:2>" outputted from a decoder & logic circuit (DECODER & LOGIC) 34 is determined, and further, a logic of a signal line "bSRA <0:2> connected to the wired OR node is determined.

When the signal line "bRRON" is set to "L", the normal row decoder of a bank designated by the inputted bank address is deactivated. Then, one of eight spare elements in that bank is designated by a 3-bit signal of the signal line "bSRA <0:2>, and is activated.

Now, a description will be given with respect to an operation for, in the case where all the fuse sets are used for column saving or in the case where an inputted address corresponds to a faulty element address, replacing such faulty element with a spare element.

In the present embodiment, one memory chip has eight segments, one segment has two spare elements, and a total of 16 (8×2) spare elements are arranged in the memory chip. In the case where the inputted column address and column bank address correspond to a faulty element address, such faulty element must be replaced with a spare element.

In each fuse set, in the case where the input address coincides with the address programmed by a fuse, column redundancy is used. However, only one of the spare column selection signals "chit <0:15>" is activated based on the information on 3-bit mapping fuses f13 to f15 contained in this fuse set. Further, one of the signal lines "bSCSLE <0:15>" connected to the wired OR node is set to "L". Then, it is determined which of the spare column selection lines "spare CSL <0:15> is activated by this signal "bSCSLE <0:15>" in association with 16 spare elements.

In the above first embodiment, there is used a row/column saving fuse set available for use in row saving and column saving in all the fuse sets, that is, commonly available for use in row and column. Thus, an area occupied by the fuse set on the memory chip is reduced as compared with a conventional example, and high saving efficiency is achieved.

In addition, each fuse set stores information (mapping information) on a correspondence between the fuse set and each of eight spare row decoders or information (mapping information) on a correspondence between the fuse set and each of 16 spare column selection lines. Based on the mapping information, each fuse set can be associated with a spare element. In this manner, the number of fuse sets can be fewer than the number of spare elements. Moreover, even in the case faults are distributed uniformly or in the case where faults collectively exist, such faults can be saved flexibly.

With respect to the row/column common row/column saving fuse set in the DRAM according to the first embodiment, as compared with the conventional row specific row saving fuse set "rfuse set" or column specific column saving fuse set "cfuse set", at least one fuse increases, and the number of circuits increases at the logic portion.

In the above first embodiment, such row/column common saving fuse set is used for all of the fuse sets, and thus, the number of fuses and the number of logic circuits increase. Further, the number of pull-down NMOS transistors that communicate with a wired OR node for outputting signals "bSRA <0:2>, bRRON, and bSCSLE <0:15>" also increases, and thus, the load capacity of the wired OR node increases, resulting in slower wired OR processing. These problems are not serious, and can be easily avoided, but can occur essentially.

Now, a DRAM (dynamic random access memory) according to a second embodiment of the present invention will be described here. The second embodiment makes it possible to restrict an increased number of fuses in a fuse set and an increased number of logic circuits as described above.

In the case of carrying out fault saving in one memory chip, it is almost rare that all the fault saving operations are made for row saving or column saving in a one-sided manner. It is determined depending on probability as to whether row saving or column saving is carried out. Therefore, there is no need to use row/column common saving fuse sets for all the fuse sets.

Figure 9:
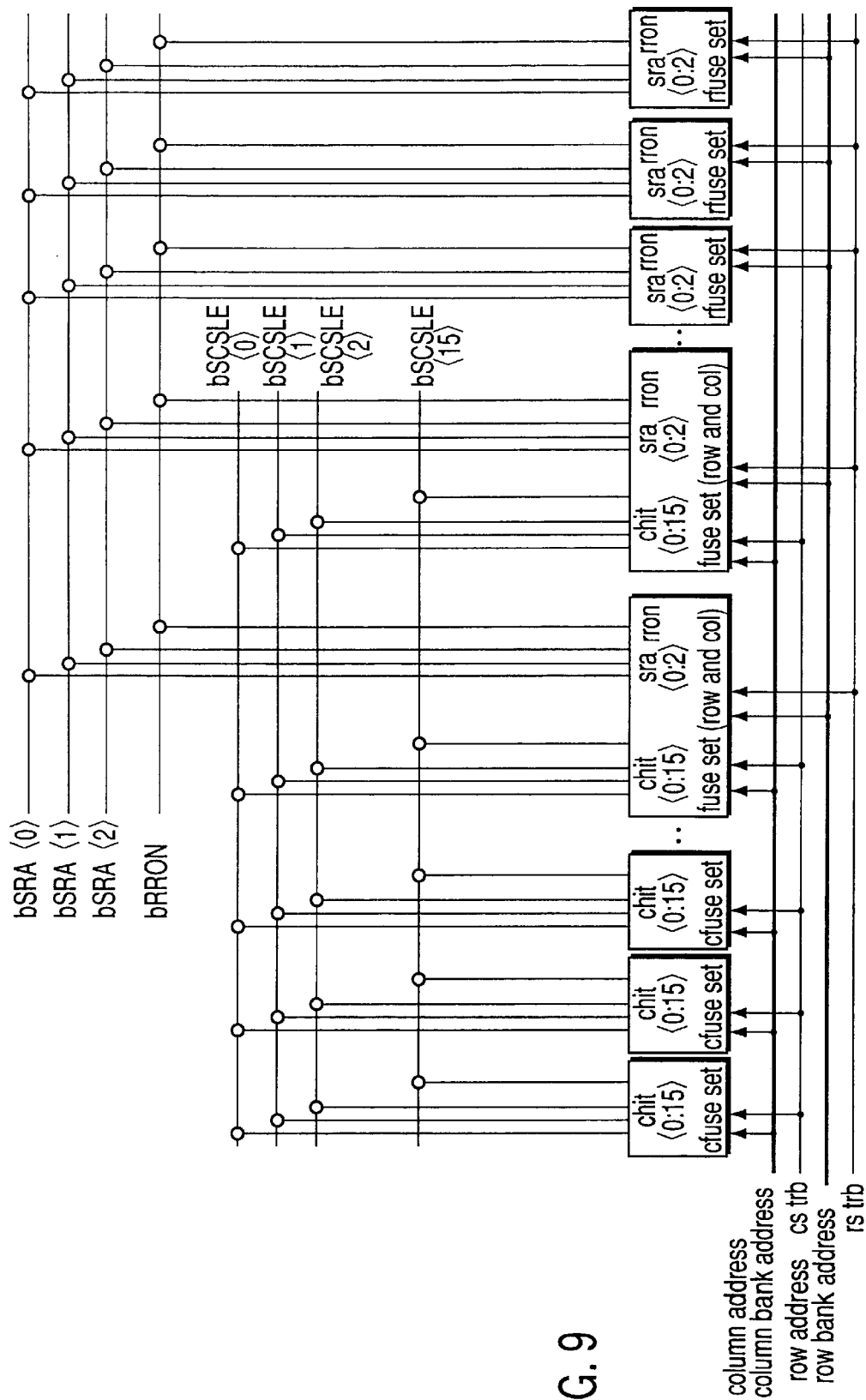
FIG. 9 is a schematic diagram of an example of combination of DRAM fuse sets according to a second embodiment of the present invention.

In the second embodiment, as shown in FIG. 9, there are provided a row specific row saving fuse set "rfuse set" similar to the conventional example for only the probably expected number for row saving and column saving and a column specific column saving fuse set "cfuse set" similar to a conventional example. On the other hand, a row column common saving fuse set "fuse set (row and co)" is provided in number that corresponds to a deviation from the probability distribution. The row/column common saving fuse set (row and co) is selectively used as a row saving fuse set or a column saving fuse set.

With such arrangement, an area is reduced to an extent such that an increase in area occupied by fuse sets on a memory chip can be ignored, and an increase in load capacity of a wired OR node is restricted. In addition, slower wired OR processing can be restricted, and a significant increase in saving efficiency is expected.

In each of the above embodiments, 16 fuses are required when a row/column common saving fuse set is used for row saving; and 15 fuses are required when a row/column common saving fuse set is used for column saving. Thus, one unused fuse occurs if the row/column common saving fuse set is used for column saving.

In general, in the case where "n" fuses are used for rows, and "m" fuses are used for columns, if a fuse set is used for column saving when n>m, "n–m" fuses are redundant. In contrast, when n<m, if a fuse set is used for row saving, "m–n" fuses are redundant. That is, when $|n-m|=0$, the number of fuses can be utilized most efficiently. AS $|n-m|$ increases, the number of fuses that could be wasteful increases, which makes it difficult to keep an allocation area.

Such fuses that could be wasteful (redundant fuses) can be diverted to another purpose. A comparatively simple utilization method is to expand a redundancy function.

For example, in the case of carrying out column saving, in the present embodiment, when a normal column selection line "normal CSL" is replaced with a spare column selection line "spare CSL" in order to save a faulty column designated in one fuse set, it has been necessary to designate a bank and a segment. At this time, in the case where one normal column selection line "normal CSL" causes a fault over all the banks, eight fuse sets corresponding to the banks each are required. In this case, the redundant fuse in a fuse set can have the following meaning.

Figure 10:
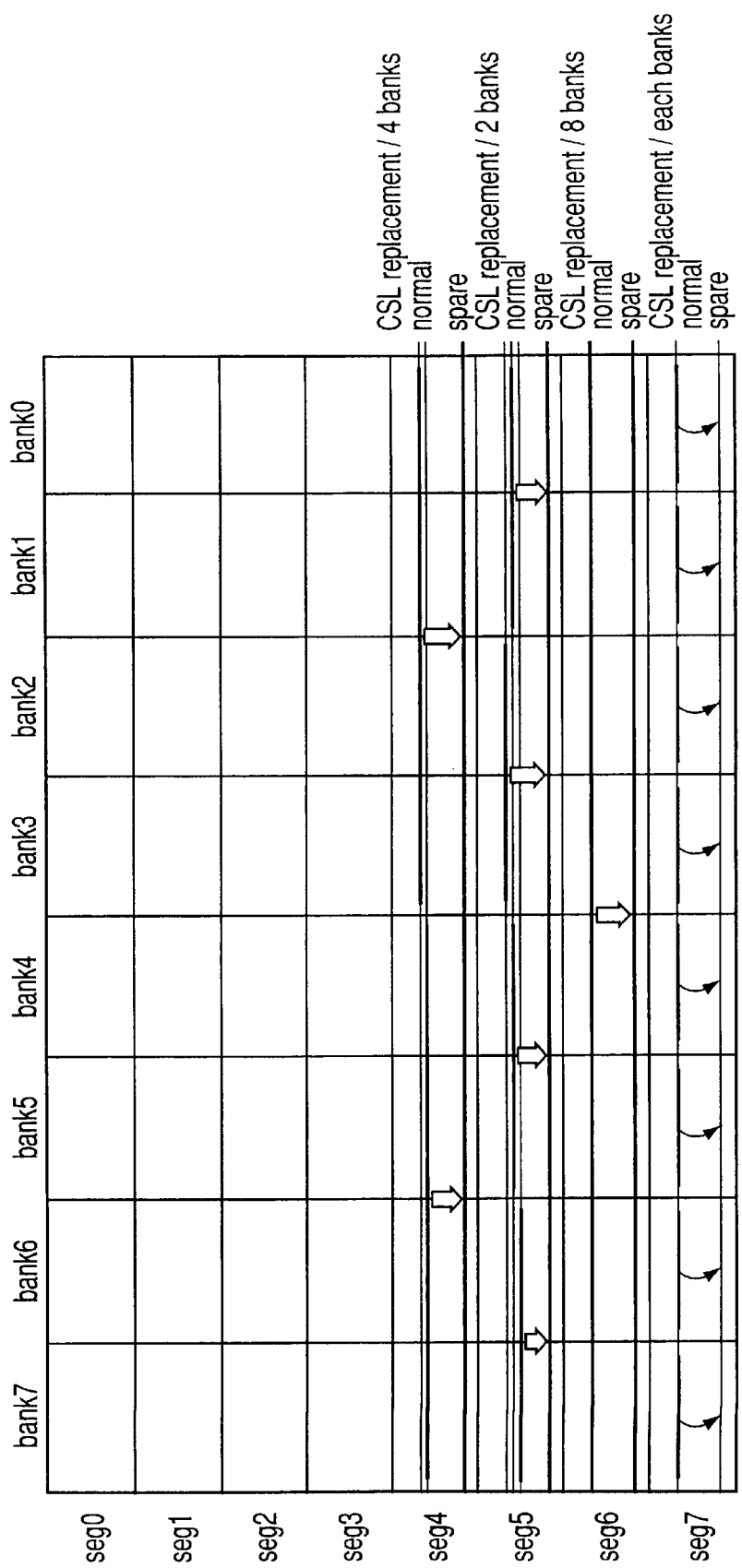
FIG. 10 is a diagram for explaining a case when, in the case where the row/column common saving fuse sets shown in FIG. 3 are used for column saving, a redundancy fuse that could be wasteful is diverted to expansion of a redundancy function.

That is, as shown in FIG. 10, for example, if a redundant fuse is disconnected in one fuse set, whereby a normal column selection line "normal CSL" is replaced with a spare column selection line "spare CSL" relevant to all the banks, eight fuse sets are eliminated for saving a faulty column, enabling replacement with only one fuse set.

Further, in the case where there exist a plurality of redundant column saving fuses, as shown in FIG. 10, these fuses are allocated so as to control simultaneous replacement of eight banks, four banks, or two banks, thereby making it possible to improve saving efficiency more remarkably.

Figure 11:
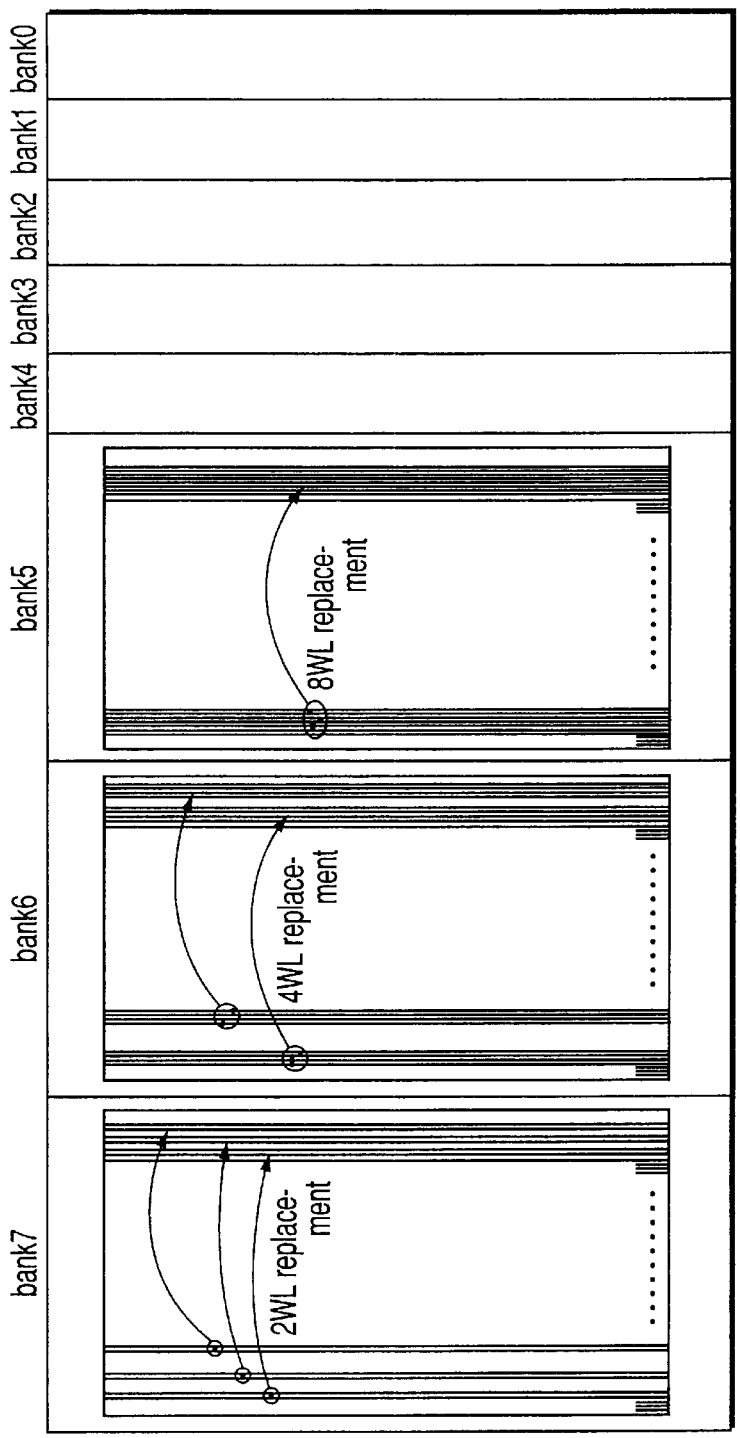
FIG. 11 is a diagram for explaining a case when, in the case where the row/column common saving fuse sets shown in FIG. 3 are used for row saving, a redundancy fuse that could be wasteful is diverted to expansion of a redundancy function.
Figure 12:
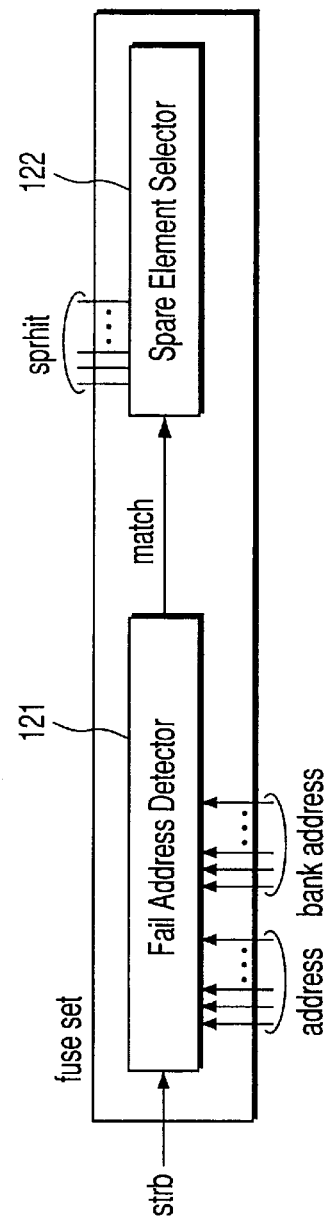
FIG. 12 is a schematic diagram of a fuse set used for a conventional memory chip.
Figure 13:
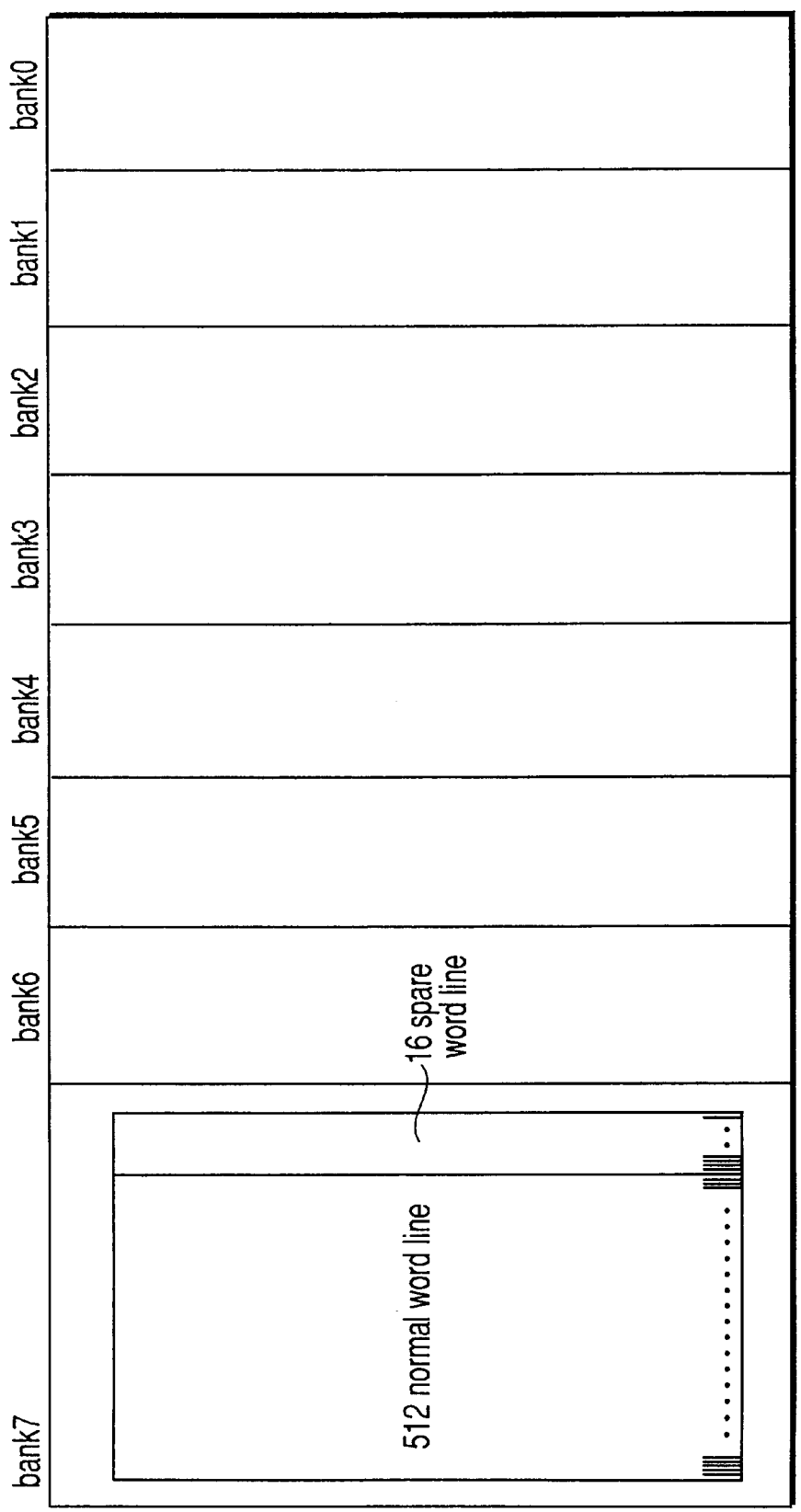
FIG. 13 is an example of configuration in a row direction of a memory cell array in the conventional memory chip.

On the other hand, in the case where there exists a plurality of redundant row saving fuses, as shown in FIG. 11, for example, row saving can be expanded by using such redundant fuses. That is, in the present embodiment, although word lines are replaced by two, they can be replaced by four, 16, or one. Doing this enables to save in fewer fuse sets. In particular, such replacement is effective in a case in which a number of continuous word lines fail due to a large defect or a huge amount of dust.

As described previously, the fuses (redundant fuses) that could be wasteful may be used for a purpose other than expansion of redundancy function as described above. However, in the case where a significant disadvantage occurs such as an increased area occupied by a fuse set as the redundancy function as described above is expanded, such redundant fuses may be left unused.

In addition, in the above embodiments, although a fuse is used as a nonvolatile storage element that configures a faulty address storage circuit, there can be employed a variety of other nonvolatile semiconductor storage elements such as ROM, EPROM, or EEPROM. Further, the semiconductor memory device to which the present invention is applied may include a storage device embedded with a logic LSI or the like.

As has been described above, according to the semiconductor memory device of the present invention, there is used a fuse set to which a flexible mapping redundancy technique is applied. Thus, mapping information relevant to a column redundancy element is stored in a storage circuit that stores a faulty address, whereby faulty cells can be saved reliably even in the case where such faulty cells collectively exist at a portion of the memory cell array. Moreover, the number of column redundancy elements required for saving a faulty cell is reduced, thereby making it possible to improve area efficiency of the redundancy circuit.

Further, a row/column common saving fuse set configured so as to make it available for use in one of row saving and column saving is used for at least one of the fuse sets. Thus, even in the case where a number of row faults occur with a memory chip or in the case where the case where a number of column faults occur, the setting of row saving or column setting of the row/column common saving fuse set can be adjusted accordingly, whereby the saving efficiency is improved, and high saving efficiency in a small area can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array comprising a plurality of memory cells arranged in a plurality of rows and in a plurality of columns, said memory cell array being divided into a plurality of sub-cell arrays;
   a row redundancy element and a column redundancy element disposed in correspondence to each of said sub-cell arrays;
   a normal row decoder for selecting a row of said memory cell array according to an input address;
   a normal column decoder for selecting a column of said memory cell array according to an input address;
   a plurality of information storing circuits each storing an address of a faulty memory cell contained in each memory cell array and storing mapping information indicating a correspondence between said each storing circuit and said row redundancy element or a correspondence between said each storing circuit and said column redundancy element, said information storing circuits being adopted to output a row saving control signal for replacing said faulty memory cell with said row redundancy element or a column saving control signal for replacing said faulty memory cell with said column redundancy element based on said mapping information and a match result in said case where said address of said faulty memory cell coincides with an input address;
   a control circuit for deactivating said normal row decoder according to said row saving control signal supplied from said information storing circuit;
   a spare row decoder activated according to said row saving control signal supplied from said information storing circuit, said spare row decoder selecting said row redundancy element;
   a control circuit for deactivating said normal column decoder according to said column saving control signal supplied from said information storing circuit; and
   a spare column decoder activated according to said column saving control signal supplied from said information storing circuit, said spare column decoder selecting said column redundancy element,
   wherein at least one of said plurality of information storing circuits is a row/column common information storing circuit that contains a first nonvolatile storage element capable of programming information on whether row saving or column saving is carried out by using said information storing circuit, and that is selectable for use in either one of said row saving and column saving.

2. A semiconductor memory device according to claim 1, said plurality of information storing circuits each comprising:
   a plurality of second nonvolatile storage elements for storing said address of said faulty memory cell contained in said memory cell array;
   a plurality of third nonvolatile storage elements for storing said mapping information indicating a correspondence between said row or column redundancy element and said each storing circuit;
   a plurality of comparators for comparing said address of said faulty memory cells stored in said plurality of storage elements with an input address, and, outputting a match output signal in the case where said address of said faulty memory cells and said input address coincide with each other; and
   a decoder for, in the case where said match output signal is outputted from said each comparator, decoding said mapping information stored in said third storage element, and supplying said row saving control signal or column saving control signal,
   wherein said row/column common information storing circuit selects an address required for row saving or an address required for column saving as an address to be inputted to said plurality of comparators according to said storage information on said first storage element, thereby controlling said normal row decoder and spare row decoder or said normal column decoder and spare column decoder so as to supply said row saving control signal or column saving control signal.

3. A semiconductor memory device according to claim 2, wherein said plurality of information storing circuits further comprises an address input/selector circuit for receiving a row address input and a column address input, and outputting either one of said row address input and column address input based on said row saving control signal or column saving control signal to said corresponding comparators.

4. A semiconductor memory device according to claim 2, wherein said plurality of second storage elements and said plurality of third storage elements are provided in number that is identical to the number of storage elements required to store said address and mapping information in the case of carrying out row saving or column saving.

5. A semiconductor memory device according to claim 1, wherein said plurality of information storage circuits have a plurality of output terminals for outputting said row saving control signal or column saving control signal, said information storage circuits have their output terminals wired-OR-connected via a plurality of row saving control signal lines or column saving control signal lines.

6. A semiconductor memory device according to claim 1, wherein all of said plurality of information storing circuits are directed to row/column common information storing circuits.

7. A semiconductor memory device according to claim 1, wherein said sub-cell array is disposed in a M×N matrix manner, a plurality of said sub-cell arrays in a row direction configure banks, and the number of said information storing circuits is smaller than the number of said redundancy element.

8. A semiconductor memory device according to claim 7, each of said information storing circuits comprising:
- an address designation fuse for storing said address of said faulty memory cell;
- a bank address mapping information designation fuse for storing an address of each of said banks;
- a mapping fuse for storing mapping information indicating a correspondence between said each storing circuit and said row redundancy element or said column redundancy element;
- an enable fuse for storing information indicating whether or not to use said information storing circuit;
- a row/column select fuse for storing information indicating which of row saving and column saving said information storing circuit is used for;
- a plurality of address match detector circuits for detecting match between an address input selected according to a selection state of said row/column select fuse and an address stored in each of said address designation fuse and bank address mapping information designation fuse;
- a logic circuit supplied thereto a match output signal of said plurality of address match detector circuits and an output signal of said enable fuse; and
- a decoder for decoding an output signal of said mapping fuse according to an output signal of said logic circuit, thereby generating said row saving control signal or column saving control signal.

9. A semiconductor memory device according to claim 2, wherein said plurality of first storage elements and said plurality of second storage elements are different from each other in the number of storage elements required to carry out row saving and in the number of storage elements required to carry out column saving.

10. A semiconductor memory device according to claim 9, wherein information other than said faulty memory cell address and mapping information is stored in a redundant storage element of said plurality of second storage elements and said plurality of third storage elements in the case of carrying out row saving or column saving.

11. A semiconductor memory device according to claim 9, wherein, in the case of carrying out row saving or column saving, a redundant storage element of said plurality of second storage elements and said plurality of third storage elements is allocated to store replacement information in one or more banks in predetermined units of said plurality of memory cell arrays.

12. A semiconductor memory device comprising:
- a memory cell array comprising a plurality of memory cells arranged in a plurality of rows and in a plurality of columns, said memory cell array being divided into a plurality of sub-cell arrays;
- a row redundancy element and a column redundancy element disposed in correspondence to each of said sub-cell array, and
- a plurality of information storing circuits each storing an address of a faulty memory cell contained in each memory cell array and storing mapping information indicating a correspondence between said each storing circuit and said row redundancy element or a correspondence between said each storing circuit and said column redundancy element, said information storing circuits being adopted to output a row saving control signal for replacing said faulty memory cell with said row redundancy element or a column saving control signal for replacing said faulty memory cell with said column redundancy element based on said match result and said mapping information in the case where said address of said faulty memory cell coincides with an input address;
- wherein at least one of said plurality of information storing circuits is a row/column common information storing circuit that contains a first nonvolatile storage element capable of programming information on whether row saving or column saving is carried out by using said information storing circuit, and that is selectable for use in either one of said row saving and column saving.

13. A semiconductor memory device according to claim 12, wherein said semiconductor memory device further comprises:
- a normal row decoder for selecting a row of said memory cell array according to an input address;
- a normal column decoder for selecting a column of said memory cell array according to an input address;
- a spare row decoder activated according to said row saving control signal supplied from said information storing circuit, said spare row decoder selecting said row redundancy element, and a spare column decoder activated according to said column saving control signal supplied from said information storing circuit, said spare column decoder selecting said column redundancy element.

14. A semiconductor memory device according to claim 13, said plurality of information storing circuits each comprising:
- a plurality of second nonvolatile storage elements for storing said address of said faulty memory cell contained in said memory cell array;
- a plurality of third nonvolatile storage elements for storing said mapping information indicating a correspondence between said row or column redundancy element and said each storing circuit;
- a plurality of comparators for comparing said address of said faulty memory cells stored in said plurality of storage elements with an input address, and, outputting a match output signal in the case where said address of said faulty memory cells and said input address coincide with each other; and
- a decoder for, in the case where said match output signal is outputted from said each comparator, decoding said mapping information stored in said third storage element, and supplying said row saving control signal or column saving control signal,
- wherein said row/column common information storing circuit selects an address required for row saving or an address required for column saving as an address to be inputted to said plurality of comparators according to said storage information on said first storage element, thereby controlling said normal row decoder and spare row decoder or said normal column decoder and spare column decoder so as to supply said row saving control signal or column saving control signal.

15. A semiconductor memory device according to claim 14, wherein said plurality of information storing circuits further comprises an address input/selector circuit for receiving a row address input and a column address input, and outputting either one of said row address input and column address input based on said row saving control signal or column saving control signal to said corresponding comparators.

16. A semiconductor memory device according to claim 14, wherein said plurality of second storage elements and said plurality of third storage elements are provided in number that is identical to the number of storage elements required to store said address and mapping information in the case of carrying out row saving or column saving.

17. A semiconductor memory device according to claim 12, wherein said plurality of information storage circuits have a plurality of output terminals for outputting said row saving control signal or column saving control signal, said information storage circuits have their output terminals wired-OR-connected via a plurality of row saving control signal lines or column saving control signal lines.

18. A semiconductor memory device according to claim 12, wherein all of said plurality of information storing circuits are directed to row/column common information storing circuits.

19. A semiconductor memory device according to claim 12, wherein said sub-cell array is disposed in a M X N matrix manner, a plurality of said sub-cell arrays in a row direction configure banks, and the number of said information storing circuits is smaller than the number of said redundancy element.

20. A semiconductor memory device according to claim 19, said information storing circuit comprising:
   an address designation fuse for storing said address of said faulty memory cell;
   a bank address mapping information designation fuse for storing an address of said bank;
   a mapping fuse for storing mapping information indicating a correspondence between said each storing circuit and said row redundancy element or said column redundancy element;
   an enable fuse for storing information indicating whether or not to use said information storing circuit;
   a row/column select fuse for storing information indicating which of row saving and column saving is used for by said information storing circuit;
   a plurality of address match detector circuits for detecting match between an address input selected according to a selection state of said row/column select fuse and an address stored in each of said address designation fuse and bank address designation fuse;
   a logic circuit supplied thereto a match output signal of said plurality of address match detector circuits and an output signal of said Enable fuse; and
   a decoder for decoding an output signal of said mapping fuse according to an output signal of said logic circuit, thereby generating said row saving control signal or column saving control signal.

21. A semiconductor memory device according to claim 14, wherein said plurality of first storage elements and said plurality of second storage elements are different from each other in the number of storage elements required to carry out row saving and in the number of storage elements required to carry out column saving.

22. A semiconductor memory device according to claim 21, wherein information other than said faulty memory cell address and mapping information is stored in a redundant storage element of said plurality of second storage elements and said plurality of third storage elements in the case of carrying out row saving or column saving.

23. A semiconductor memory device according to claim 21, wherein, in the case of carrying out row saving or column saving, a redundant storage element of said plurality of second storage elements and said plurality of third storage elements is allocated to store replacement information in one or more banks in predetermined units of said plurality of memory cell arrays.

* * * * *